United States Patent

Ohara

[11] Patent Number: 5,926,396
[45] Date of Patent: *Jul. 20, 1999

[54] LOGIC SYNTHESIS METHOD, SEMICONDUCTOR INTEGRATED CIRCUIT AND ARITHMETIC CIRCUIT

[75] Inventor: Kazutake Ohara, Osaka, Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/653,651

[22] Filed: May 24, 1996

[30] Foreign Application Priority Data

May 26, 1995 [JP] Japan .................... 7-127819

[51] Int. Cl.$^6$ .................... G06F 17/50; H03K 19/0175
[52] U.S. Cl. .................... 364/490; 364/489; 364/491; 326/80; 257/299
[58] Field of Search .................... 364/488–491, 364/578, 438, 113, 345, 190; 326/41, 80; 365/189; 307/475; 257/299

[56] References Cited

U.S. PATENT DOCUMENTS

| 3,950,636 | 4/1976 | Dao .................... 235/164 |
| 4,713,796 | 12/1987 | Ogiue et al. .................... 365/189 |
| 5,115,408 | 5/1992 | Darley et al. .................... 364/754 |
| 5,119,314 | 6/1992 | Hotta et al. .................... 364/491 |
| 5,245,224 | 9/1993 | Suzuki et al. .................... 307/446 |

(List continued on next page.)

FOREIGN PATENT DOCUMENTS

| 2-187063 | 7/1990 | Japan .................... H01L 27/88 |
| 4-96369 | 3/1992 | Japan . |
| 4-223616 | 8/1992 | Japan .................... H03K 19/175 |
| 4-253366 | 9/1992 | Japan . |
| 5-67963 | 3/1993 | Japan . |
| 5-289851 | 11/1993 | Japan .................... G06F 7/52 |
| 5-299624 | 12/1993 | Japan . |
| 6-348459 | 12/1994 | Japan .................... G06F 7/50 |
| WO 86/02792 | 5/1986 | WIPO .................... H03K 19/092 |

OTHER PUBLICATIONS

C. Mead et al.: Introduction to VLSI systems, pp. 75–76; Addision–Wesley, 1980.

Wecker, T. et al: "CALLAS–a system for automatic digital synthesis" Informatik Forschung und Entwicklung, 1989, West Germany, vol. 4, No. 1, pp. 37–54, XP002087621, ISSN 0178–3564, Jan. 1989.

(List continued on next page.)

Primary Examiner—Emanuel Todd Voeltz
Assistant Examiner—Phallaka Kik
Attorney, Agent, or Firm—McDermott, Will & Emery

[57] ABSTRACT

A top-down design technique is used to design a semiconductor integrated circuit having a plurality of registers and a plurality of combinational circuits each of which is connected between the registers. When a semiconductor integrated circuit is logic-synthesized from a register transistor level, a front section of a critical path-containing combinational circuit is driven by a high voltage from a high-voltage source while the remaining section and other combinational circuits with no critical path are driven by a low voltage from a low-voltage source. A level shifter is placed at the stage before the critical path-containing combinational circuit. The level shifter converts a low-voltage signal into a high-voltage one. This invention facilitates logic synthesis of a low-power semiconductor circuit without increasing the maximum signal propagation delay of the critical path and without having to provide a level shifter in a combinational circuit.

32 Claims, 41 Drawing Sheets

U.S. PATENT DOCUMENTS

| | | | |
|---|---|---|---|
| 5,300,835 | 4/1994 | Assar et al. | 307/475 |
| 5,311,083 | 5/1994 | Wanlass | 307/475 |
| 5,352,942 | 10/1994 | Tanaka et al. | 307/475 |
| 5,517,132 | 5/1996 | Ohara | 326/41 |
| 5,541,849 | 7/1996 | Rostoker et al. | 364/489 |
| 5,557,533 | 9/1996 | Koford et al. | 364/491 |
| 5,559,464 | 9/1996 | Orii et al. | 327/333 |
| 5,594,368 | 1/1997 | Usami | 326/80 |
| 5,612,892 | 3/1997 | Almulla | 364/489 |
| 5,661,413 | 8/1997 | Tomita et al. | 326/80 |
| 5,723,986 | 3/1998 | Nakashiro et al. | 326/81 |

OTHER PUBLICATIONS

De Man, H., et al.: "Cathedral–II: a silicon compiler for digital signal processing" IEEE Design & Test of Computers, Dec. 1986, USA, vol. 3, No. 6, pp. 13–25, XP002087622, ISSN 0740–7475.

E. J. McCluskey: "Logic Design Principles", 1986, Prentice–Hall, Englewood Cliffs, New Jersey, XP002087572, 539784 pp. 439–440.

Kojima et al., "Half–Swing Clocking Scheme for 75% Power Saving in Clocking Circuitry", 1994 IEEE, Symposium on VLSI Circuits Digest of Technical Papers, pp. 23–24.

Mou et al., "Overturned–Stairs Adder Trees and Multiplier Design", IEEE Transactions on Computers 41 (1992), No. 8, pp. 940–948.

Hill et al., "Digital Systems: Hardware Organization and Design", 1978, p. 257.

Taub et al., "Digital Integrated Electronics", 1977, p. 246.

PTO 99–0682 (Translation of Japanese Published Unexamined (Kokai) Patent Application No. H2–187063, published Jul. 23, 1990; Application No. H1–7315, filed Jan. 13, 1989; Invented by Akinori Matsuda; translated Nov. 25, 1998 by Translation Branch o.

PTO 99–0683 (Translation of Japanese Published Unexamined (Tokkyo Koho) Patent Application No. 04–223,616; published Aug. 13, 1992; Application No. 02–406,042, filed Dec. 25, 1990; invented by Takayasu Skurai et al.; translated by Translations Branc, Dec. 4, 1998.

Goodby et al. ("Microarchitectural synthesis of performance–constrained, low–power VLSI designs", IEEE Comput. Soc. Press, Proceedings of IEEE International Conference on Computer Design: VLSI in Computers and Processors, Oct. 10, 1994).

Chandrakasan et al. ("Optimizing power using transformations", IEEE Transaction on Computer–Aided Design of Integrated Circuits and Systems, vol. 14, No. 1, Jan. 1995, pp. 12–31).

Goodby et al. ("A High–Level Synthesis Methodology for Low–Power VLSI Design", 1994 IEEE Symposium on Low Power Electronics, Oct. 10, 1994, pp. 48–49).

Usami et al. ("Clustered Voltage Scaling Technique for Lower–Power Design", Proceedings of the 1995 International Symposium on Low Power Design, Low Power Design Symposium, Apr. 23, 1995, pp. 3–8).

Fig.10

```
module demo4(clk,r,q);
 input         clk,r;
 output [3:0]  q;
 wire [3:0]    qx;
 reg [3:0]     q;

function [3:0]  fq;
 input           r;
 input [3:0]     q;

if(r)
    fq = 4'h0;
 else
    if(q < 4'd9)
        fq = q + 1'b1;
    else
        ;

endfunction assign qx = fq(r,q);

always @(posedge clk)
    q = qx;

endmodule
```

Fig.11

```
module demo4 ( clk, r, q );
output [3:0] q;
input clk, r;
 wire net7, net8, net9, net10, n60, n51, n52, n53, n54, n55, n56, n57, n58,
      n59;

MD40C \q_reg[0]   ( .NQ(net10),  .Q(q[0]),   .CK(clk),   .D(n60) );
MD40C \q_reg[1]   ( .NQ(net9),   .Q(q[1]),   .CK(clk),   .D(n59) );
MC22E U20   ( .Y(n59),   .A(n60),   .B(n56),   .S(net9) );
MC11E U21   ( .Y(n57),   .A(net7),  .B(n51),   .C(net8),  .D(n52) );
MD40C \q_reg[2]   ( .NQ(net8),   .Q(q[2]),   .CK(clk),   .D(n58) );
MC43E U22   ( .Y(n60),   .B(net10), .NA(n51) );
MC6E U23   ( .Y(n53),   .A(net10), .B(net8),  .C(net9),  .D(net7) );
MO2E U24   ( .Y(n51),   .A(n53),   .B(r) );
MD40C \q_reg[3]   ( .NQ(net7),   .Q(q[3]),   .CK(clk),   .D(n57) );
MO3E U25   ( .Y(n52),   .A(net9),  .B(net10), .C(n51) );
MC44E U26   ( .Y(n54),   .B(n51),   .NA(net9) );
MC43E U17   ( .Y(n55),   .B(n54),   .NA(n60) );
MC21E U18   ( .NY(n58),  .A(n55),   .B(n52),   .S(net8) );
MR2E U19   ( .Y(n56),   .A(net10), .B(n51) );
endmodule
```

Fig.14

Table 1 Cell lists of Conventional

| Conventional CMOS Library (61 cells) |||
|---|---|---|
| INVERTER | 4AND | 2OR/2AND |
| INVERTER_P2 | 4AND_P2 | 2OR/2AND_P2 |
| INVERTER_P4 | 2OR | 3OR/2AND |
| INVERTER_P8 | 2OR_P2 | 3OR/2AND_P2 |
| 2NAND | 3OR | 2ANDx2/2OR |
| 3NAND | 3OR_P2 | 2ANDx2/2OR_P2 |
| 2NOR | 4OR | 3ANDx2/2OR |
| 2NOR_P2 | 4OR_P2 | 3ANDx2/2OR_P2 |
| 3NOR | 2AND/2NOR | 2ANDx3/3OR |
| 3NOR_P2 | 2ANDx2/2NOR | 2ANDx3/3OR_P2 |
| 4NOR | 3AND/3NOR | 2ANDx2/3OR |
| 4NOR_P2 | 2OR/2NAND | 2ANDx2/3OR_P2 |
| 2XOR | 2OR/3NAND | 2ORx2/2AND |
| 2XOR_P2 | 3OR/2NAND | 2ORx2/2AND_P2 |
| 2XNOR | 2AND/2OR | 2ANDx4/4OR |
| 2XNOR_P2 | 2AND/2OR_P2 | 2ANDx4/4OR_P2 |
| 2AND | 3AND/2OR | 8NAND |
| 2AND_P2 | 3AND/2OR_P2 | 8NAND_P2 |
| 3AND | 2AND/3OR | 8AND |
| 3AND_P2 | 2AND/3OR_P2 | 8AND_P2 |
|  |  | 8OR |

(_P2._P4._P8 represent x2.x4.x8 powered cells)

Fig.17

```
module circuit (in, out);

input  in;
  output out;

reg  r1, out;
  wire r2x;

function func AB
    ...
  endfunction assign r2x = func AB (r1);

always @(posedge clk)
    begin
      r1 = in;
      out = r2x;
    end endmodule
```

Fig. 18

```
module circuit (in, out);

input in;
output out;

reg r1, r2, out;
wire r2x, r3x;

function funcA
  ...
endfunction function funcB
  ...
endfunction assign r2x = funcA (r1)
assign r3x = funcB (r2)

always @ (posedge clk)
  begin
    r1 = in;
    r2 = r2x;
    out = r3x;
  end endmodule
```

Fig.23

```
module add8(a,b,c,d,e,f,g,h,y);
input  a,b,c,d,e,f,g,h;
output y;

wire   a1,b1;

assign a1 = (a + b) + (c + d);
assign b1 = (e + f) + (g + h);
assign y  = a1 + b1;       // low_power_synthesis_high_voltage endmodule
```

Fig. 24

```
module add8(a,b,c,d,e,f,g,h,y);
input    a,b,c,d,e,f,g,h;
output   y;

wire     a1,b1;

assign a1 = (a + b) + (c + d);
assign b1 = (e + f) + (g + h);
assign y  = a1 + b1;

endmodule
```

Fig. 29

```
module circuit (out, in, clk);

input in, clk;
    output out;

reg r1, r2, r3, r4;          // REGISTER DEFINITION
    wire r1x, r2x, r3x, r4x;

function func1;              // COMBINATIONAL CIRCUIT
        ...                              func1
    endfunction function func2;              // COMBINATIONAL CIRCUIT
        ...                              func2
    endfunction function func3;              // COMBINATIONAL CIRCUIT
        ...                              func3
    endfunction function func4;              // COMBINATIONAL CIRCUIT
        ...                              func4
    endfunction assign r1x = func1(...)
    assign r2x = func2(...)
    assign r3x = func3(...)
    assign r4x = func4(...)

always@(posedge clk)         // REGISTER TRANSFER
        begin
            r1 = r1x;
            r2 = r2x;
            r3 = r3x;
            r4 = r4x;
        end endmodule
```

Fig.33

```
/* multiplier -- carry save method */ module mul(x,y,z);
input  [7:0] x;          // 8 bits
input  [7:0] y;          // 8 bits
output [14:0] z;         // 15 bits wire [14:0] s;           // sum
wire [13:6] c;           // carry function[22:0] aroad;    // function 'array of adder'
input [7:0] x;
input [7:0] y;
    ...
endfunction assign {c[13:6],s[14:0]} = aroad(x,y);   // call 'array of adder' assign z[6:0]  = s[6:0];
assign z[14:7] = s[14:7] + c[13:6];      // low_power_synthesis_high_voltage endmodule
```

LOGIC SYNTHESIS METHOD, SEMICONDUCTOR INTEGRATED CIRCUIT AND ARITHMETIC CIRCUIT

BACKGROUND OF THE INVENTION

1. Field of the Invention

This invention relates to an improved logic synthesis method for generating from register transfer levels (RTLS) a semiconductor integrated circuit. Particularly, this invention pertains to a logic synthesis method capable of generating a low-power semiconductor integrated circuit (SIC) and to a low-power SIC made by means of the logic synthesis method.

2. Description of Related Art

Various top-down design techniques have been employed for generating SICs. A top-down design technique represents a target SIC with RTL functional descriptions. More specifically, a target SIC is generated from RTL functional descriptions by means of logic synthesis.

FIG. 29 shows RTL functional descriptions. FIG. 30 shows a logic circuit, i.e., an SIC, generated from the RTL functional descriptions.

The functional descriptions specify respective register-to-register data transfers, at functional level. r1, r2, r3 and r4 are registers. func1, func2, func3 and func4 are functional descriptions of combinational circuits (CCs) each of which is connected between the registers. assign is a sentence descriptive of a connection relationship between a signal and a CC. Also, always is a sentence descriptive of a connection relationship between a register and a signal.

When synthesizing a logic circuit from the RTL functional descriptions shown in FIG. 29, the circuit is determined on the area/rate tradeoff curve by giving a constraint of the area and a constraint of the rate.

FIG. 30 shows the resulting logic circuit. 101, 103, 105 and 107 are flip-flop (FF) circuits mapped from r1, r2, r3 and r4 by means of logic synthesis. There is a direct correspondence between the FF circuits (101, 103, 105, 107) and the registers (r1, r2, r3, r4). 108 is a clock buffer. 100, 102, 104 and 106 are CCs and there exists a correspondence between these CCs and func1–func4. The CCs 100, 102, 104 and 106 are circuits that are mapped, as circuits on the area/rate tradeoff curve, from the FIG. 29 RTL functional descriptions.

The power consumption of an SIC, P, can be found by the following equation.

$$P = f \times C \times V^2$$

where f is the operating frequency, C is the load capacitance and V is the supply voltage. There are three possible ways of reducing P. The first is to reduce f. The second is to reduce C. The last is to reduce V. Of these three ways the third one is considered the most attractive way since it is able to the most effectively reduce the power consumption.

However, there is the problem that as the supply voltage V decreases, a critical path of a great number of paths together forming a logic circuit, which has the maximum delay of all the paths, comes to have a greater delay.

With a view to providing a solution to the foregoing problem, Japanese Patent Application, published under Pub. No. 5-299624, proposes a technique. In accordance with this technique, low-speed logic gates, not required to operate at a high speed, are driven by a low-voltage source, whereas high-speed logic gates, required to operate at a high speed, are driven by a high-voltage source. This technique is trying to achieve a low-power SIC by driving logic gates forming a critical path by a high-voltage source and by driving other logic gates by a low-voltage source, with no increase in critical path's delay. This approach, however, produces the following drawbacks.

Suppose data is transferred from a slow logic gate driven by a low-voltage source to a fast logic gate driven by a high-voltage source. In this case, there is a need to arrange between these two logic gates a level shifter capable of converting a low-level output from the slow logic gate to a high level (see Japanese Patent Application, published under Pub. No. 5-67963). However each of the CCs shown in FIG. 30 is made up of great many logic gates (see FIGS. 31 and 32). In order to drive a critical path, represented by bold line, by high voltage, level shifters must be arranged at points marked with circles. In FIG. 31, a required number of level shifters is eight. In FIG. 32, twelve level shifters must be placed. A high-density SIC includes a great number of CCs, therefore containing a great number of logic gates. Accordingly, a critical path-containing CC of the high-density SIC requires a great number of level shifters. In addition, there are many CCs with a critical path. This means that the placement of an enormous number of level shifters is required. In high-density SIC design, it may be possible to determine where to place level shifters in a particular CC. However, it becomes considerably troublesome to determine where to place level shifters in an entire SIC. The placement of level shifters is therefore time consuming and design work becomes most complicated.

SUMMARY OF THE INVENTION

Bearing in mind the above-mentioned problems with the prior art techniques, the present invention was made. It is therefore an object of the present invention to provide an improved logic synthesis method capable of facilitating low-power SIC (semiconductor integrated circuit) generation, with no increase in the delay time of critical paths contained in CCs (combinational circuits) of an SIC. It is another object of the present invention to provide a low-power SIC, with no increase in the critical path delay time.

By directing attention to the following points, this invention was made. An SIC, shown in FIG. 30, is formed by many registers and many CCs connected between the registers. If it is arranged so that a register contains a level shifter, this eliminates the need for placing a level shifter at plural locations of CCs at which the provision of level shifters is required at the time of driving a critical path by high voltage. This cuts down the number of level shifters required.

Statistically, it is said that in an SIC, the number of logic gates arranged along critical paths is about 5% of the total number of logic gates contained in the entire SIC. Therefore, the ratio of the number of CCs having a critical path versus the total number of CCs contained in the entire SIC is negligible. Even if, as illustrated above, a register is provided with a level shifter and the entirety of a critical path-containing CC that receives data from the level shifter is driven by high voltage, this will not result in a great increase in power consumption.

It is sufficient that the critical path maximum delay is held below a design delay upper limit. The entire CC with a critical path is not necessarily driven by high voltage. By driving a part of the CC by high voltage, it becomes possible to reduce the maximum delay time to below the design delay upper limit and, as a result, the power consumption can be held as low as possible.

As a general rule, a level shifter is arranged only in a register and only a part of a CC having a critical path is driven by a high-voltage source.

The present invention provides a logic synthesis method for synthesizing, based on interconnection information of logic cells, a semiconductor integrated circuit having a plurality of registers and a plurality of combinational circuits each of which is connected between the registers. This logic synthesis method comprises:

(a) a first step that includes:

mapping, when there exists a combinational circuit in said plural combinational circuits that has a signal propagation delay not more than a design delay upper limit, said combinational circuit into a combinational circuit of a first type driven by a low voltage from a low-voltage source;

mapping, when there exists a combinational logic circuit in said plural combinational circuits that has a signal propagation delay above the design delay upper limit, a part of said combinational circuit into a combinational circuit of a second type driven by a high-voltage from a high-voltage source, and mapping the remaining part of said combinational circuit into a combinational circuit of the first type in order that said combinational circuit has a signal propagation delay below the design delay upper limit;

(b) a second step that includes:

checking if said first step produces a mixture of a combinational circuit of the first type and a combinational circuit of the second type arranged such that an output from said first-type combinational circuit serves as an input to said second-type combinational circuit;

if such a mixture is found to exist, remapping said first-type combinational circuit into a combinational circuit of the second type;

(c) a third step that includes:

determining which of said plural registers provides a signal to said mapped second-type combinational circuit or to said remapped second-type combinational circuit;

mapping a register of said plural registers that is found to provide a signal to said second-type combinational circuit into a register driven by a voltage from a voltage source including said high-voltage source, and mapping a register of said plural registers that is found to provide no signal to said second-type combinational circuit into a register driven by a low voltage from said low-voltage source.

The present invention is characterized in that the first step includes:

conceptually dividing, if there exists a combinational circuit of the first type that has a signal propagation delay above the design delay upper limit, said first-type combinational circuit into plural combinational circuit elements, and remapping the first of said plural combinational circuit elements into a combinational circuit of the second type;

checking if said post-remapping combinational circuit has a signal propagation delay above the design delay upper limit;

remapping, when said post-remapping combinational circuit is found to still have a signal propagation delay above the design delay upper limit, the second combinational circuit element, located next to the aforesaid first combinational circuit element in the direction of signal propagation in said first-type combinational circuit, into a combinational circuit of the second type, checking if said post-remapping combinational circuit of the second type has a signal propagation delay above the design delay upper limit, and repeating said remapping/checking processing.

The present invention is characterized in that:

said first step including:

(i) setting in a combinational circuit of combinational circuit elements that has a signal propagation delay above the design delay upper limit a plurality of windows having a specified size, each said window serving as a search range;

(ii) selecting from among said plural windows a window that contains a group of combinational circuit elements of said elements whose total area or total delay is the smallest, and mapping said group as a part of said combinational circuit into a combinational circuit of the second type;

(iii) placing a level shifter at a stage before said mapped second-type combinational circuit.

The present invention provides a semiconductor integrated circuit comprising a plurality of registers and a plurality of combinational circuits each of which is connected between said registers wherein:

a part of said plural combinational circuits are formed of combinational circuits of a first type driven by a low voltage from a low-voltage source;

an internal section of each of the remaining part of said plural combinational circuits is formed of a combinational circuit of a second type driven by a high voltage from a high-voltage source and the remaining internal section thereof is formed of a combinational circuit of the first type;

of said plural registers one with a combinational circuit of the second type on its output side is formed of a register driven by a voltage from a voltage source including said high-voltage source.

The present invention provides an arithmetic circuit comprising a plurality of arithmetic element rows each of which contains a given number of arithmetic elements wherein (A) arithmetic elements contained in the first of said plural arithmetic element rows each receive an external signal, (B) arithmetic elements contained in the remaining other arithmetic element rows each receive an output from arithmetic elements contained in its preceding arithmetic element row, and (C) arithmetic elements contained in the last of said plural arithmetic element rows each provide an arithmetic operation result, said arithmetic elements contained in the last arithmetic element row being driven by a high voltage from a high-voltage source;

said arithmetic elements contained in the remaining other arithmetic element rows except the last arithmetic element row being driven by a low voltage from a low-voltage source;

a level shifter driven by a high-voltage from said high-voltage source being placed between an arithmetic element of the last arithmetic element row and another of its preceding arithmetic element row so that a low-voltage output signal from said arithmetic element of said preceding arithmetic element row is converted into an output signal having a high voltage from said high-voltage source.

Advantages of the present invention are as follows. A semiconductor integrated circuit of this invention is formed by a plurality of registers and a plurality of CCs connected between the registers, wherein some of the CCs have a critical path. A register located at a stage before a critical-path containing CC, i.e., a register that provides data to the critical path containing CC, is provided with a level shifter. Only a part of the critical path-containing CC is driven by high voltage. The remaining part thereof is driven by low voltage. The other CCs having no critical path are driven by low voltage.

Since a part of a critical path-containing CC is driven by high voltage, this allows the critical path to have a delay below the design delay upper limit. Additionally, a register ahead of a critical path-containing CC is provided with a single level shifter, which makes it possible to further reduce the number of level shifters required in comparison with cases where only critical paths are driven by high voltage. This facilitates the SIC design process. Since the ratio of the number of critical path-containing CCs to the total number of Ccs is negligible and only a part of such a "rare" critical path-containing CC is driven by high-voltage, this holds the increase in power consumption as low as possible. Meanwhile, the remaining part of that critical path-containing CC and the many other CCs without a critical path are driven by low voltage, which greatly reduces the power consumption. As a result, the SIC overall power consumption is reduced.

Additionally, combinational circuit elements (CCES) forming a CC are mapped one after another into a CCE of the second type in the order in which they receive a signal, in other words, such mapping is carried out in the direction of input signal propagation. As a result of such arrangement, it becomes possible to define an exact boundary between a part of a specific CC and the remaining part thereof (i.e., a boundary between an area of a CC to be mapped into a CC of the first type and an area thereof to be mapped into a CC of the second type). This minimizes the number of CCEs of the second type driven by high voltage, therefore further reducing power consumption.

In accordance with the present invention, a part of a CC to be a CC of the second type is searched using a window. A section, which is found to have either a minimum CCE area (i.e., a smallest number of CCEs) or a lowest processing rate, is designated as a part to be mapped into the second-type CC. This arrangement achieves further reduction of the power consumption and improves the rate of processing.

The present invention provides an arithmetic circuit with many inputs and a few outputs. Only an arithmetic element at the end is driven by high voltage, which, in comparison with a case where a plurality of arithmetic elements on the input side are driven by high voltage, achieves further reduction of the power consumption. Additionally, a level shifter is arranged only in front of the arithmetic element at the end. This, in comparison with a case where a level shifter is arranged in front of each arithmetic element on the input side, requires a less number of level shifters.

BRIEF DESCRIPTION OF THE DRAWINGS

FIG. 10 shows a set of descriptions in hardware language.

FIG. 11 shows a net list.

FIG. 14 shows a cell library table.

FIG. 17 shows a set of RTL descriptions.

FIG. 18 shows a set of RTL descriptions modified when logic synthesis cannot be executed.

FIG. 23 shows functional descriptions serving as input of a logic synthesis method according to the present invention.

FIG. 24 shows functional descriptions serving as input of a conventional logic synthesis method.

FIG. 29 shows a set of RTL descriptions.

FIG. 33 shows functional descriptions serving as input of a logic synthesis method in accordance with a sixth embodiment of the present invention.

DETAILED DESCRIPTION OF THE INVENTION

Referring now to the accompanying drawings, preferred embodiments of the present invention will be described below.

EMBODIMENT 1

Figure 1:
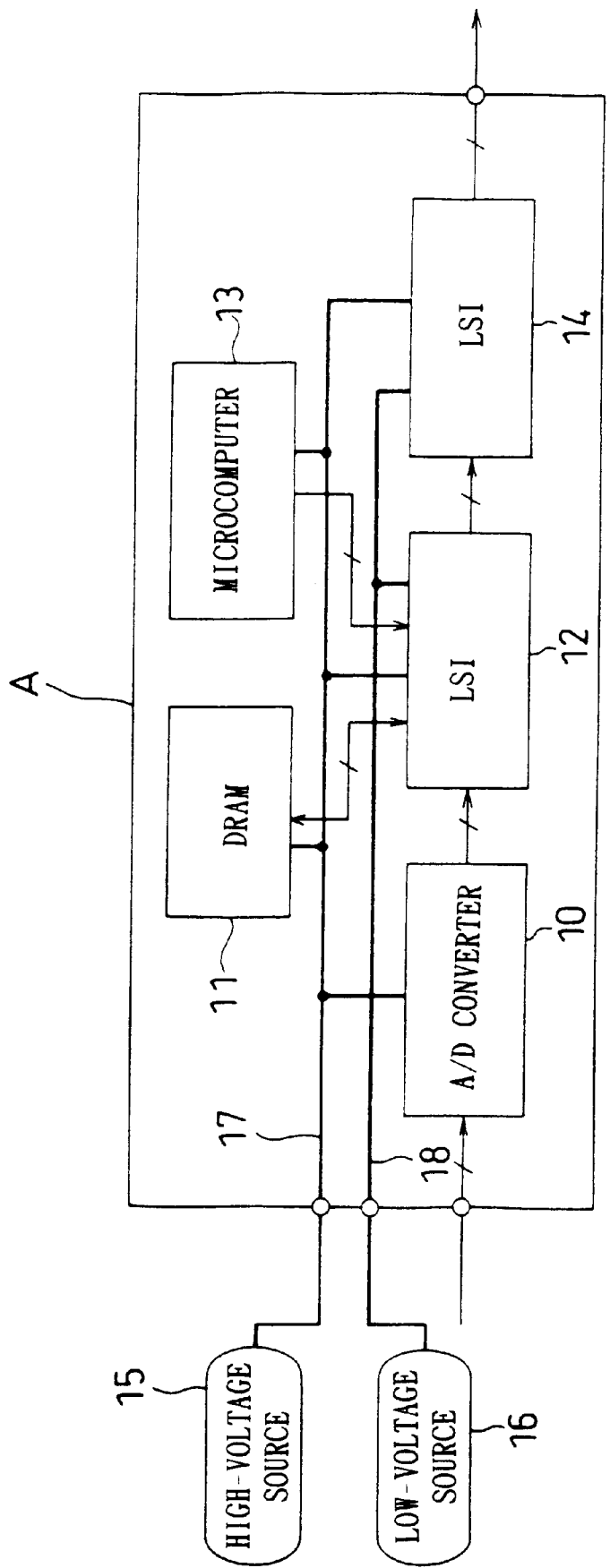
FIG. 1 schematically shows the entire structure of an image processor.

FIG. 1 schematically shows an image processor A employing an SIC (semiconductor integrated circuit) based on the present invention. 10 is an analog-to-digital converter (ADC) for converting an external analog signal to a digital output. 11 is a general dynamic random access memory (DRAM). 12 is a first SIC of the present invention capable of reading data from the DRAM 11 or writing data to the DRAM 11 while performing image processing. 13 is a general microcomputer for controlling the first SIC 12. 14 is a second SIC which receives signals from the first SIC 12 to perform image processing.

15 is a source of high voltage (for example, 3 V) which is arranged outside the image processor A. 16 is a source of low voltage (for example, 2 V) which is arranged outside the image processor A. The image processor A has a high-voltage line 17 coupled to the high-voltage source 15 and a low-voltage line 18 coupled to the low-voltage source 16. In order to achieve reduction of the power consumption of the image processor A, the low-voltage source 16, which is a voltage source for the first and second SICs 12 and 14, supplies low-level voltages through the low-voltage line 18 to the first and second SICs 12 and 14 only. On the other hand, high-level voltages are applied through the high-voltage line 17 to the ADC 10, to the DRAM 11, and to the microcomputer 13. Since a high-level interface voltage is required between circuits of the circuits 10–14, a high-level voltage is also applied to the first and second SICs 12 and 14.

It is possible to replace the low-voltage source 16 with an internal low-voltage source the supply voltage of which results from lowering the voltage of the high-voltage line 17 by means of an internal transistor by its threshold voltage. Such an internal low-voltage source is shown in Japanese Patent Application, published under Pub. No. 4-96369. The externally-arranged, low-voltage source 16 is no longer required.

Figure 2:
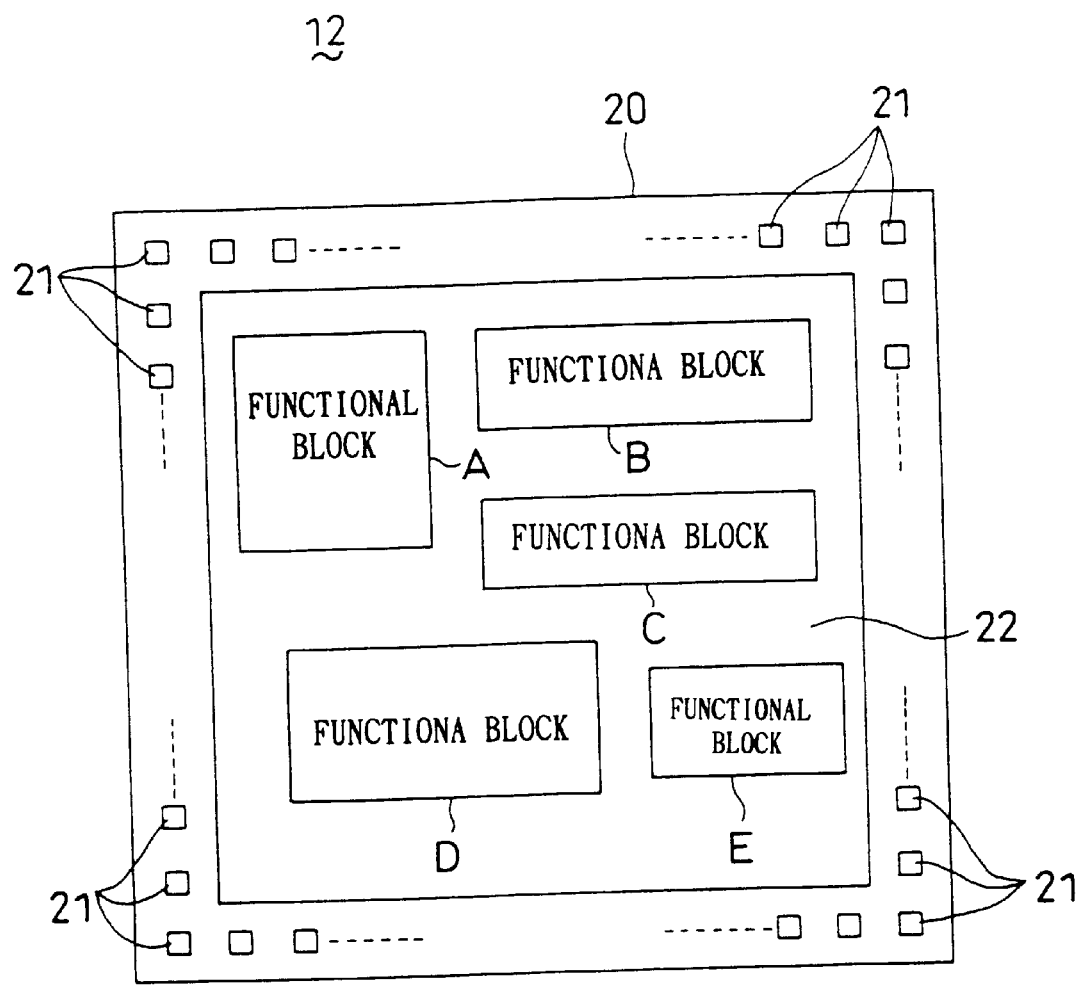
FIG. 2 schematically shows the entire structure of a semiconductor chip.

FIG. 2 depicts the internal structure of the first SIC 12 for image processing. 20 is a chip. 21, 21 are input/output pads provided on the peripheral areas of the chip 20. 22 is an internal core section that is an area other than the areas where the input/output pads 21 are arranged. Provided within the internal core section 22 are five functional blocks A, B, C, D, and E. The functional blocks A–E are arithmetic processing circuits for performing different arithmetic operations. For example, the functional block E is formed of a memory cell section with a small storage capability, e.g., ROM and RAM.

The present invention is applied to the functional blocks A–D of the first SIC 12.

Figure 3:
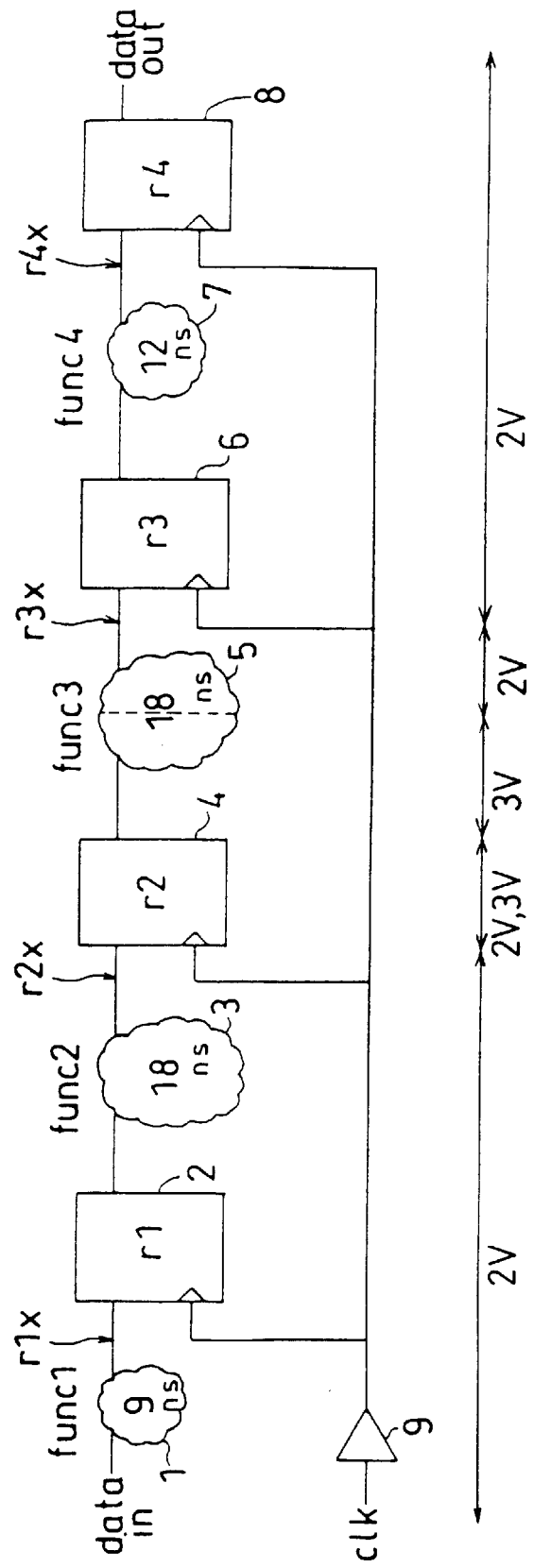
FIG. 3 shows connections between registers and CCs (combinational circuits) of an SIC (semiconductor integrated circuit) made in accordance with an SIC logic synthesis method of a first embodiment of the present invention.

FIG. 3 shows a logic circuit diagram of one of the functional blocks of the first SIC 12 (e.g., the functional block A).

The functional block shown in FIG. 3 is a logic circuit generated from the FIG. 29 RTL functional descriptions by means of logic synthesis. 2, 4, 6, and 8 are FF (flip-flop) circuits respectively forming registers r1, r2, r3, and r4 of the FIG. 29 RTL functional descriptions. Each register r1–r4 is a register forming a part of a pipeline processor of the computer. 1, 3, 5, and 7 are CCs respectively forming func1, func2, func3, and func4 of the FIG. 29 RTL functional descriptions and which are arranged between the registers or at their respective preceding stages. For convenience, the output from each CC is shown in FIG. 3 such that it is applied only to a FF circuit at the next stage. However, the output of a CC may be transferred to another CC.

The FF circuits 2, 6, and 8 are 2 V FF circuits driven by the low-voltage source 16. The FF circuit 4 is a 2 V/3 V FF circuit driven by both the low-voltage source 16 and the high-voltage source 15. Whereas the 2 V/3 V FF circuit 4 has a level shifter which will be described later, the 2 V FF circuits 2, 6, and 8 have no level shifters. Each of the CCs 1, 3, and 7 is formed of a 2 V CC (2 VCC) of the first type driven by the low-voltage source 16. The CC 5, since it is required to operate at a high speed, is formed such that its front section is comprised of a 3 VCC of the second type driven by the high-voltage source 15 and the rear section is comprised of a 2 VCC of the first-type driven by the low-voltage source 16.

9 is a 2 V clock buffer driven by the low-voltage source 16. This clock buffer 9 is a clock supply means for providing a clock to each FF circuit 2, 4, 6, and 8.

Figure 4:
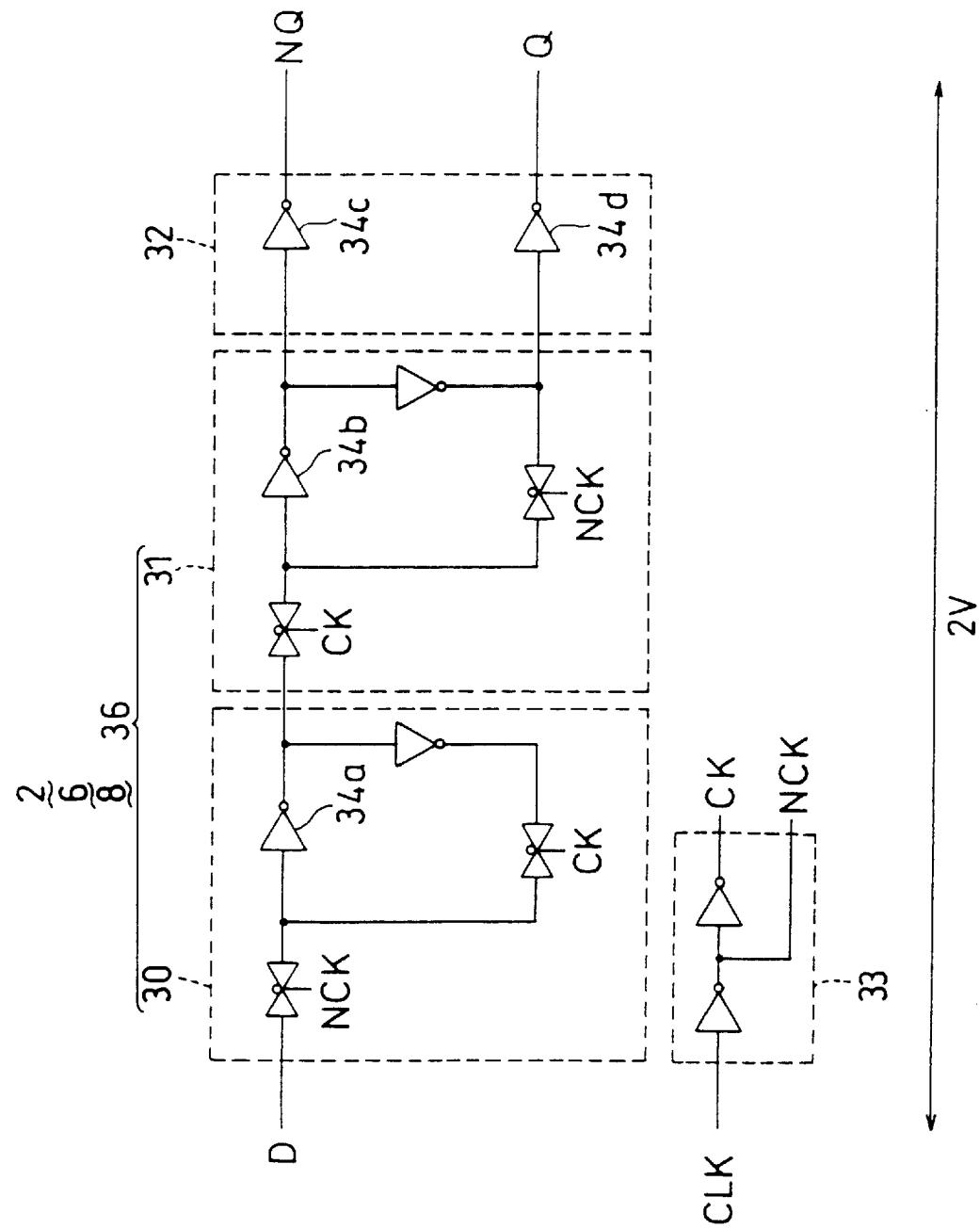
FIG. 4 shows the structure of an FF (flip-flop) circuit having no level shifters.

FIG. 4 shows the structure of the FF circuits 2, 6, and 8 having no 2 V level shifters. 30 is a master latch that receives an external signal D. 31 is a slave latch coupled in series to the output of the master latch 30. This slave latch 31 provides two signals that are in complementary relationship. The master latch 30 and the slave latch 31, which are connected in series, together form a temporary memory 36. The master latch 30 has an inverter 34a. The slave latch 31 has an inverter 34b. 32 is an output buffer that is coupled to the output of the slave latch 31. 33 is an internal clock generator that generates complementary internal clocks CK and NCK from an external clock signal CLK. These circuits 30–33 are 2 V circuits driven by the low-voltage source 16.

Figure 5:
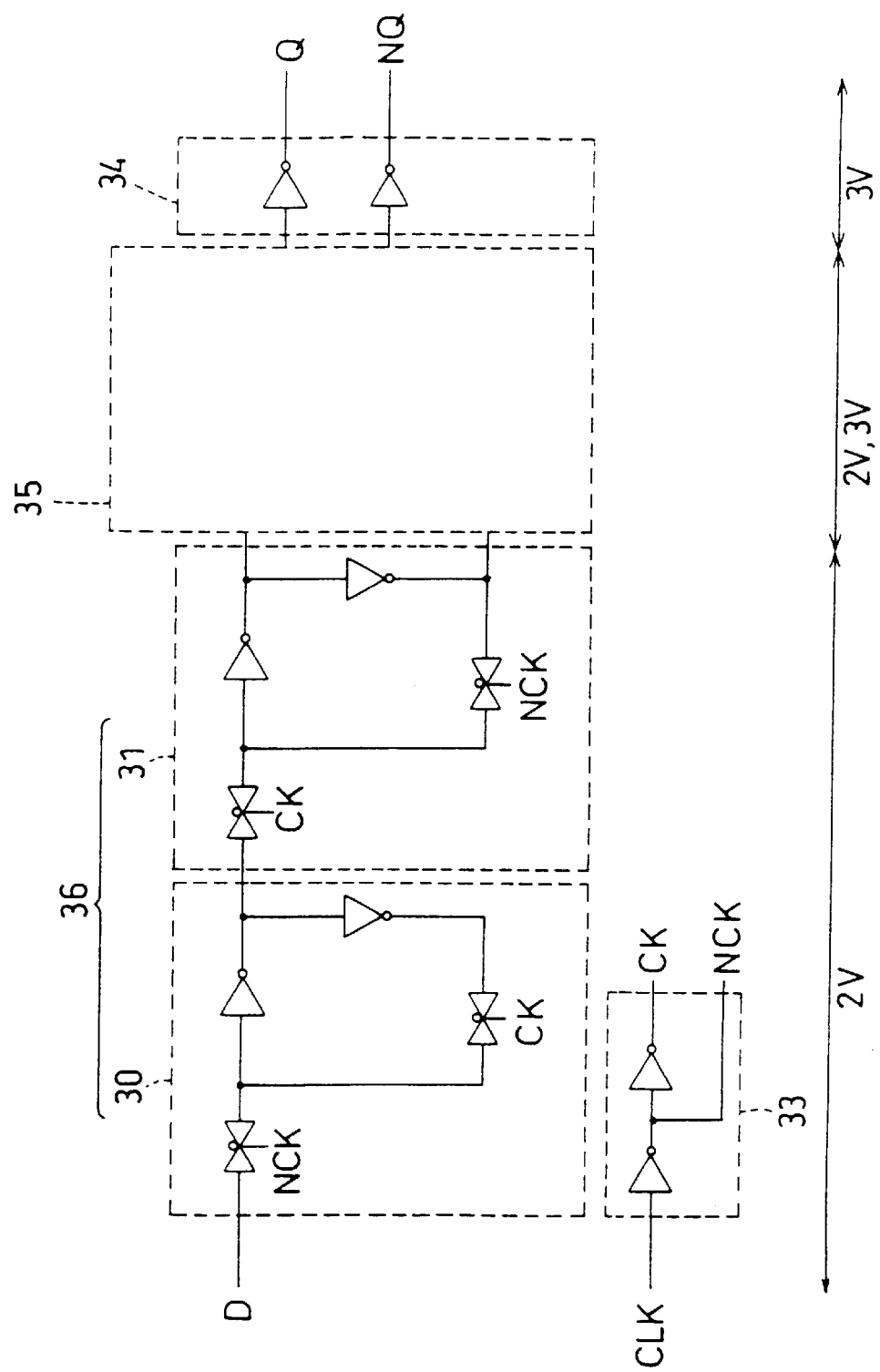
FIG. 5 shows the structure of an FF circuit having a level shifter.

FIG. 5 shows the structure of the FF circuit 4 with the foregoing 2 V/3 V level shifter. The FF circuit 4 has the master latch 30 and the slave latch 31 which are connected in series as in the 2 V FF circuit 2, and the internal clock generator 33. The FF circuit 4 further has an output buffer 34 driven by the high-voltage source 15 and a level shifter 35 connected between the slave latch 31 and the output buffer 34. This level shifter 35 is of the 2 V/3 V type. The level shifter 35 receives from the slave latch 31 complementary signals with a potential difference of 2 V (low) therebetween and performs level conversion so that the complementary signals are outputted having a greater potential difference of 3 V (high) therebetween.

Figure 6A:
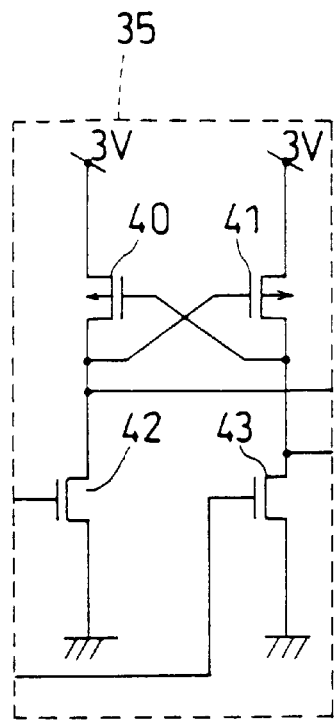
FIGS. 6a and 6b each show a level shifter structure.
Figure 6B:
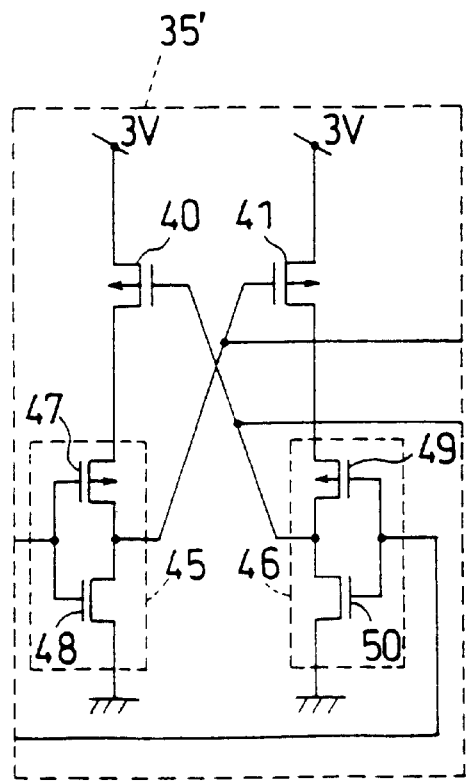

The structure of the level shifter 35 is illustrated by making reference to FIGS. 6(a) and 6(b). 40 and 41 are PMOS transistors. 42 and 43 are NMOS transistors. The PMOS transistor 40 is connected in series with the NMOS transistor 42 to form an in-series circuit. The PMOS transistor 41 is connected in series with the NMOS transistor 43 to form another in-series circuit. Both the in-series circuits are arranged between the high-voltage source 15 and ground. The gate of the PMOS transistor 40 is connected to the drain of the NMOS transistor 43. The gate of the PMOS transistor 41 is connected to the drain of the NMOS transistor 42. Complementary outputs are extracted from the drains of the NMOS transistors 42 and 43.

As a result of such arrangement, the PMOS transistor 40 and the NMOS transistor 42 jointly act as an inverter, and the PMOS transistor 41 and the NMOS transistor 43 jointly act as an inverter. The slave latch 31 gives complementary outputs so that the gate of the NMOS transistor 43 receives a low voltage of 2 V and the gate of the NMOS transistor 42 receives a voltage of 0 V. As a result, the NMOS transistor 43 turns on and the NMOS transistor 42 turns off. With such changes in the state, the PMOS transistor 40 turns on and the PMOS transistor 41 turns off. This establishes a connection between the drain of the NMOS transistor 42 and the high-voltage source 15, and the drain of the NMOS transistor 43 is connected to ground, whereupon complementary outputs are produced, with a high potential difference of 3 V existing therebetween.

One advantage of the FIG. 6(a) structure is that it is possible to perform level conversion on complementary outputs of the slave latch 31 with a potential difference of 2 V therebetween, to produce complementary outputs with a greater potential difference of 3 V therebetween wherein neither a through current from the high-voltage source 15 to the low-voltage source 16 nor a through current from the high-voltage source 15 to ground (i.e., 0 V) flows.

FIG. 6(b) shows a different level shifter 35'. This level shifter 35' does not have the NMOS transistors 42 and 43 shown in FIG. 6a but employs CMOS inverters 45 and 46 instead. The CMOS inverter 45 is formed by a PMOS transistor 47 and an NMOS transistor 48. The PMOS transistor 47 and the NMOS transistor 48 are connected in series. The CMOS inverter 46 is formed by a PMOS transistor 49 and an NMOS transistor 50. The PMOS transistor 49 and the NMOS transistor 50 are connected in series. The input terminals of the CMOS inverters 45 and 46 (i.e., the gates of the PMOS transistor 47 and the NMOS transistor 48 and the gates of the PMOS transistor 49 and the NMOS transistor 50) receive from the slave latch 31 two outputs in complementary relationship, respectively. The output terminal of the CMOS inverter 45 (i.e., a connection point where the PMOS transistor 47 and the NMOS transistor 48 are connected together) is connected to the gate of the PMOS transistor 41 which is not connected in series with the CMOS inverter 45. The output terminal of the CMOS inverter 46 is connected to the gate of the PMOS transistor 40 which is not connected in series with the CMOS inverter 46. The outputs of the CMOS inverters 45 and 46 is the complementary outputs of the level shifter 35'.

As a result of such arrangement, complementary outputs from the slave latch 31 with a 2 V difference therebetween can be level-converted into another pair of complementary outputs with a 3 V deference therebetween, wherein neither a through current from the high-voltage source 15 to the low-voltage source 16 nor a through current from the high-voltage source 15 to ground (i.e., 0 V) flows. Additionally, the PMOS transistors forming the CMOS inverters 45 and 46 control the flow of through current from the high-voltage source 15 to ground in the transient state.

As described above in FIG. 3, the FF circuit 2, which has the 2 VCC 1 on its input side and the 2 VCC 3 on the output side, is of the 2 V type. The FF circuit 4, which has the 2 VCC 3 on its input side and the 3 V/2 VCC 5 on the output side, is of the 2 V/3 V type. The FF circuit 6 has the 3 V/2 VCC 5 on its input side and the 2 VCC 7 on the output side, is of the 2 V type.

Although in the description made above each register r1–r4 is formed by an FF circuit, the register may be formed by a latch.

Figure 7:
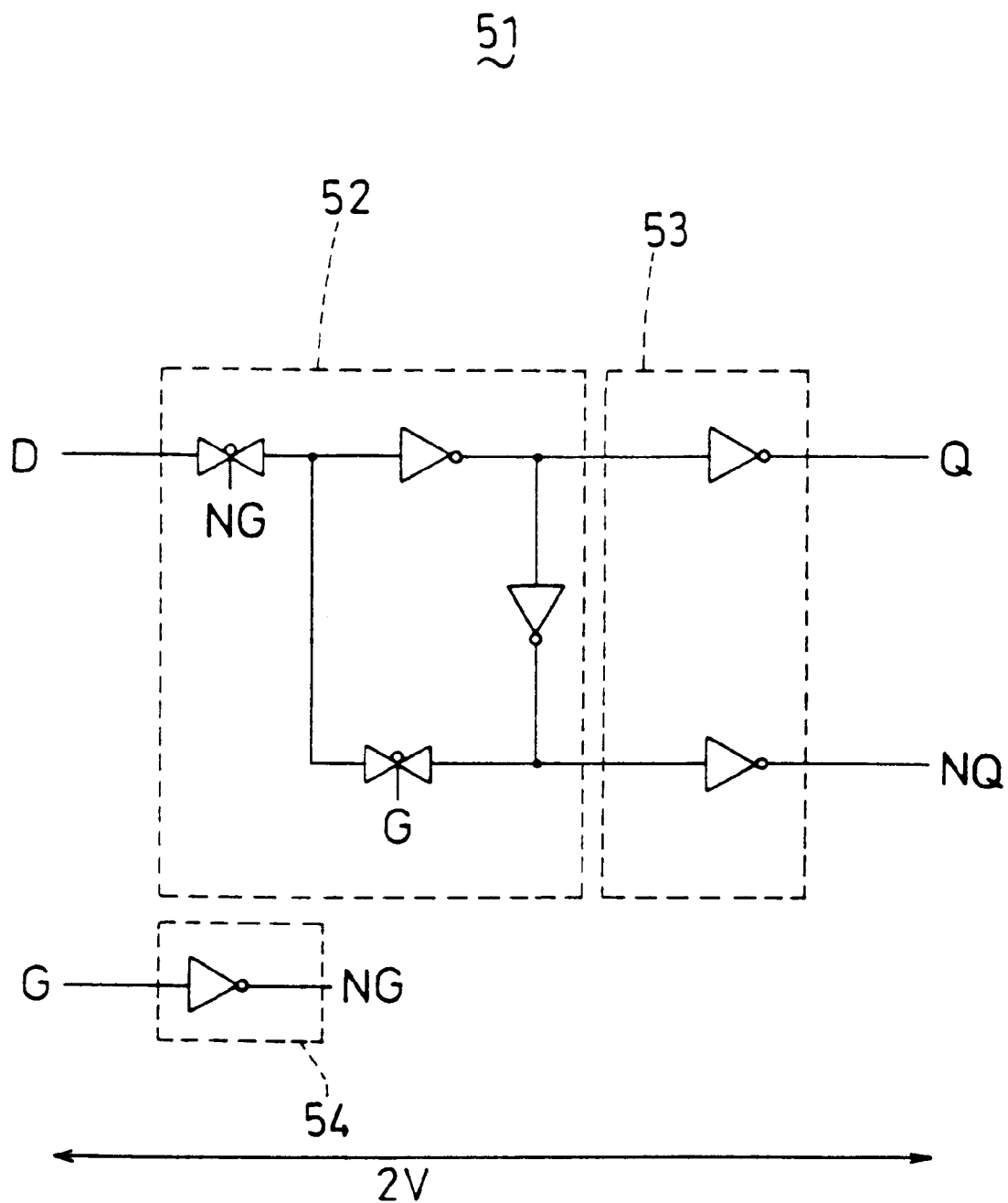
FIG. 7 shows the structure of a latch circuit having no level shifters.
Figure 8:
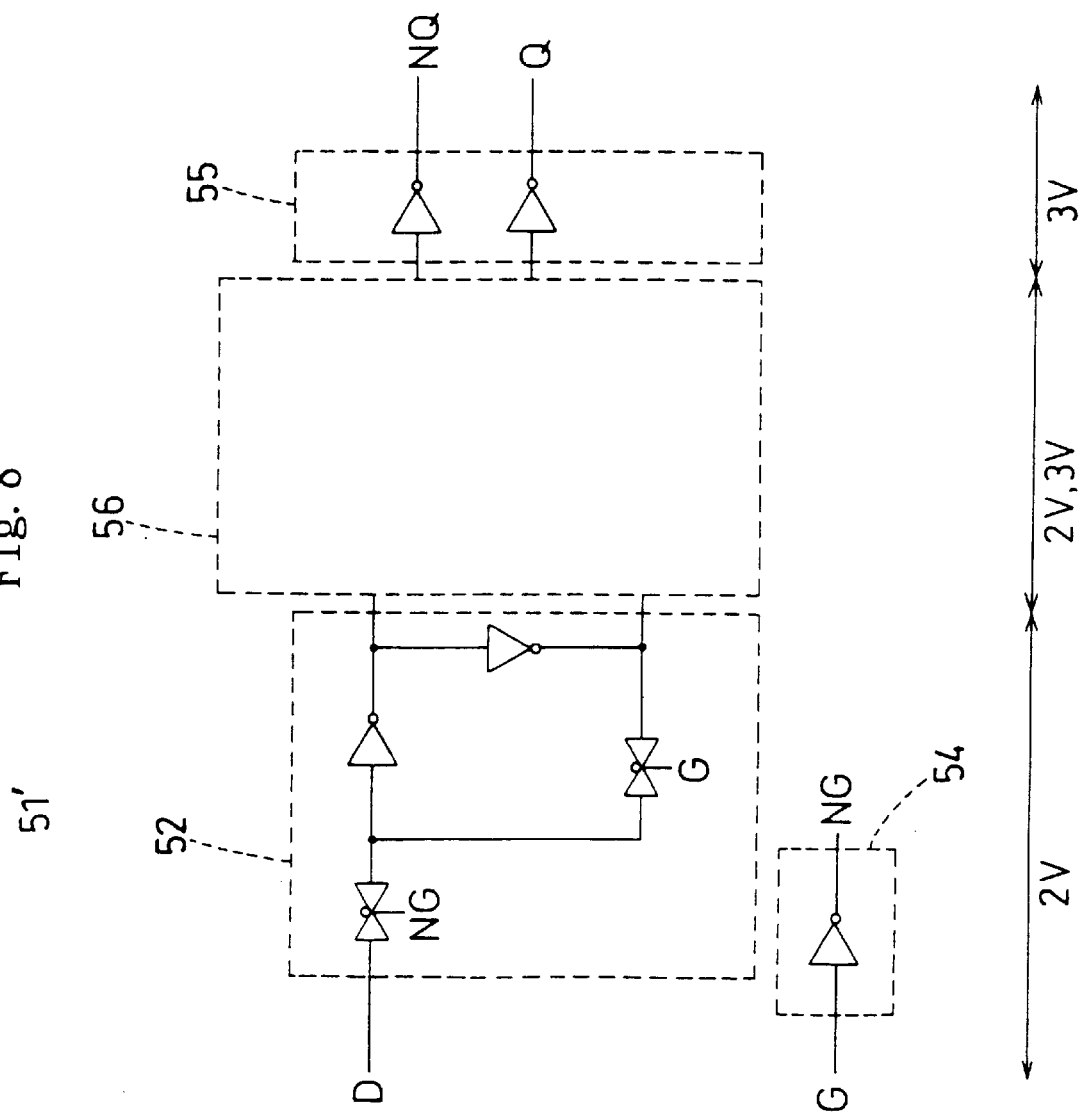
FIG. 8 shows the structure of a latch circuit having a level shifter.

Such a latch is illustrated in FIGS. 7 and 8. FIG. 7 shows a low-voltage (2 V) latch 51. The latch 51 has a latch section 52 (i.e., a temporary storage), an output buffer 53, and an internal clock generator 54. The latch section 52 inputs and latches a signal D to generate complementary outputs. The output buffer 53 is connected to the output of the latch section 52. The internal clock generators 54 generates an internal clock NG from an external clock G and provides the internal clock NG to the latch section 52. The external clock G is also applied to the latch section 52. These circuits 52–54 are of the 2 V type driven by the low-voltage source 16.

FIG. 8 shows a latch 51' of the 2 V/3 V type. The 2 V/3 V latch 51' has, in addition to the 2 V latch section 52 driven by the low-voltage source 16 and the internal clock generator 54, a 3 V output buffer 55 driven by the high-voltage source 15 and a level shifter 56 connected between the latch section 52 and the output buffer 55. The level shifter 56 receives a pair of complementary signals with a low potential difference of 2 V existing therebetween to perform a level conversion in such a way as to provide another pair of complementary signals with a high potential difference of 3 V existing therebetween. This level shifter 56 is identical in configuration with the one shown in FIG. 6(a) or in FIG. 6(b).

Figure 9:
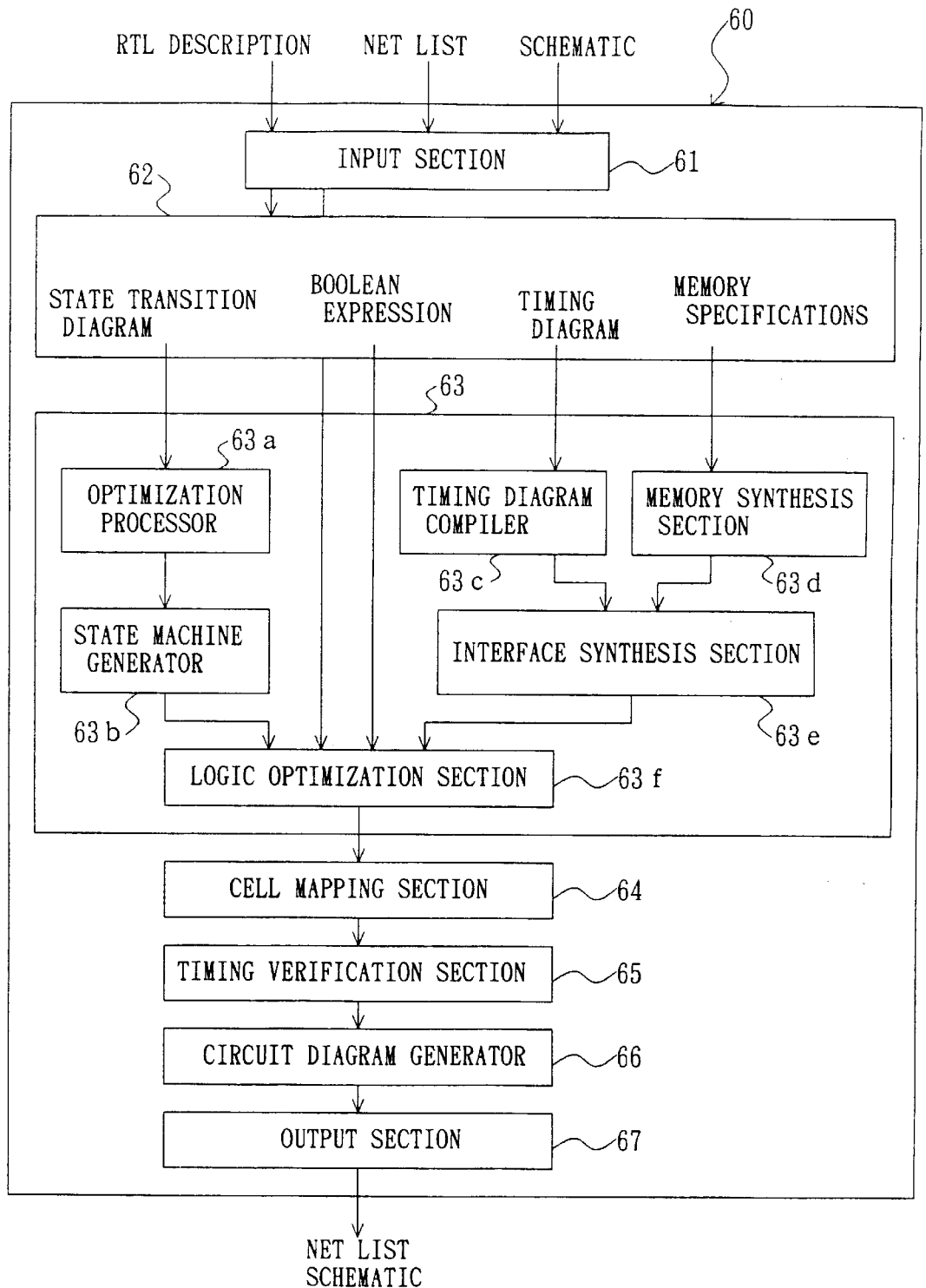
FIG. 9 schematically shows the entire structure of a logic synthesis system.
Figure 13:
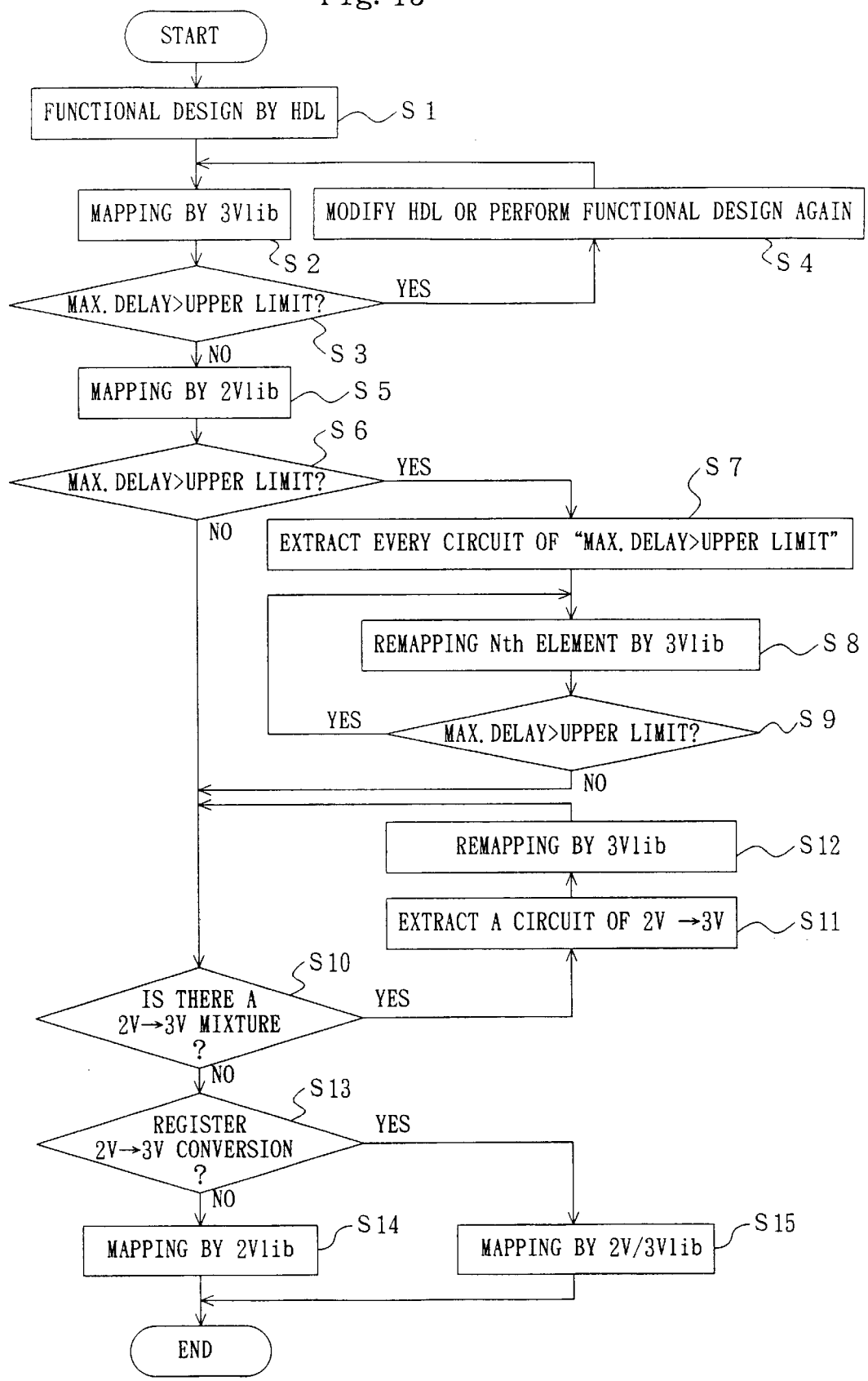
FIG. 13 is a flow chart diagram useful in understanding an SIC logic synthesis method in accordance with the first embodiment.

Referring now to FIGS. 9 and 13, a logic synthesis algorithm for the generation of an SIC of FIG. 3 according to logic-cell connection information, is described below.

FIG. 9 shows the entirety of a logic synthesis system 60. 61 is an input (read-in) section. 62 is a translation section. 63 is an optimization section. 64 is a cell mapping section. 65 is a timing verifier. 66 is a circuit diagram generator. 67 is an output section.

Figure 12:
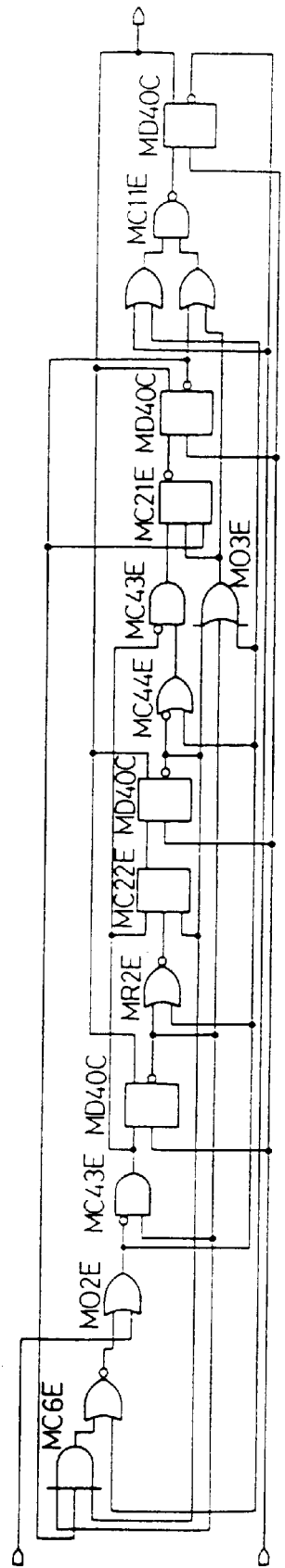
FIG. 12 shows a schematic.

The input section 61 puts in either an RTL functional description in HDL (see FIGS. 10 and 29), a net list (see FIG. 11) which specifies, on the basis of the RTL functional description, a signal transmission relationship between registers at logic cell connection information level, or a schematic (see FIG. 12) representing the net list with graphical symbols.

The translation section 62 converts the RTL functional description received from the input section 61, into a state transition diagram, a Boolean expression, a timing diagram, and memory specifications indicative of, for example, the type of memory, the number of bits, and the number of words.

The optimization section 63 has the following components: a state-transition-diagram optimization processing section 63a for optimizing the state transition diagram; a state machine generator 63b for generating a circuit (i.e., a state machine) corresponding to the optimized state transition diagram; a timing-diagram compiler 63c for compiling the timing diagram; a memory synthesis section 63d for memory synthesis according to the memory specifications; and an interface-section synthesis section 63e for synthesizing an interface section according to the compiled timing diagram and the synthesized memory. The optimization section 63 further has a logic optimization section 63f. If the input section 61 inputs an RTL functional description, then the logic optimization section 63f performs, based on the obtained state machine, the obtained Boolean expression, and the synthesized interface section, optimization of a logic in order to generate optimized logic cell connection information. On the other hand, if the input section 61 inputs either a net list or a schematic, then the logic optimization section 63f performs optimization of a logic for the net list or the schematic to generate connection information about the optimized logic.

The output section 67 provides either a net list representing the FIG. 3 logic circuit or a logic circuit diagram (a schematic) representing the net list.

The present invention is characterized by the cell mapping section 64 shown in FIG. 9. Cell mapping is carried out by the cell mapping section 64. Such cell mapping, which is an algorithm for generating the FIG. 3 SIC by logic synthesis according to cell connection information generated by the logic optimization section 63f, will now be described by reference to FIG. 13. Note that FIG. 13 mainly illustrates features of the present invention.

At step S1, a functional design process is performed using HDL descriptions. At step S2, the HDL descriptions are inputted, based on which a high-voltage (3 V) logic cell library (3 Vlib) is chosen from among logic cell libraries shown in TABLE of FIG. 14, and CC mapping is executed by this 3 Vlib.

Figure 15:
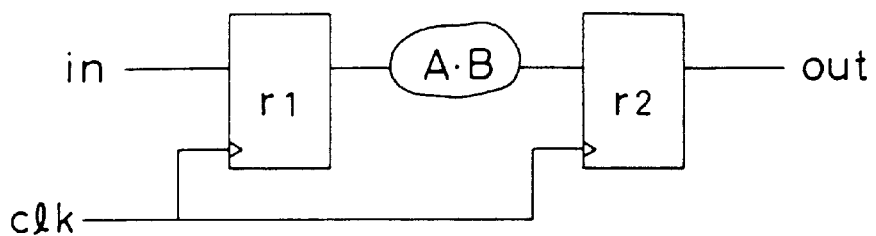
FIG. 15 shows a part of an SIC.
Figure 16:
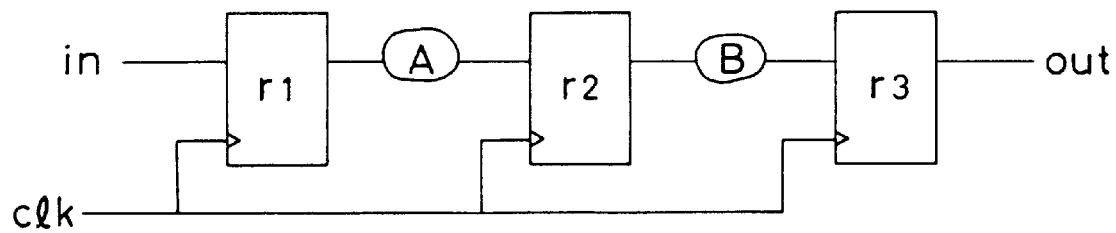
FIG. 16 shows an SIC with a modified part.

At step S3, the signal propagation delay of a CC thus mapped is calculated. The result of the calculation is then checked if it exceeds a design delay upper limit (DDUL). If the result exceeds the DDUL, then the HDL description, which was inputted at step S4, is modified or, a functional design process is performed again to create new HDL descriptions. For example, (a) if in a partial circuit shown in FIG. 15 a CC f lies between r1 and r2, (b) if the function of the CC f is comprised of a function A and a function B, and (c) if the signal propagation delay of the CC f exceeds the DDUL, then (i) the CC f is divided into a CC f1 and a CC f2 so that the CC f1 is assigned the function A and the CC f2 is assigned the function B and (ii) the FIG. 17 functional description is modified to the FIG. 18 description wherein another register is connected between the CC f1 and the CC f2, thereby increasing the number of registers to three (r1, r2, r3).

At steps S5–S9 (the first processing), every CC having a signal propagation delay below the DDUL is mapped into a CC of the first type driven by the low-voltage (2 V) source 16. Conversely, for the case of a CC having a signal propagation delay above the DDUL, its front section is mapped into a CC of the second type driven by the high-voltage (3 V) source 15 while the rear section is mapped into a CC of the first type driven by the low-voltage (2 V) source 16.

The first processing (steps S5–S9) is carried out as follows. At step S5, all CCs are mapped into low-voltage (2 V) CCs of the first type, in other words mapping is carried out by 2 Vlib. At step S6, the signal propagation delay of each CC thus mapped is calculated for every signal propagation path. If the result is determined to exceed the DDUL, then every CC with a delay in excess of the DDUL is extracted at step 7. After such CC extraction, steps S8 and S9 are performed. Suppose that such an extracted CC is formed of m combinational circuit elements (CCEs). Then, at step S8, the nth (n=1) of the m CCEs is subjected to remapping by a high-voltage (3 V) CC of the second type, or by 3 Vlib. At step S9, the signal propagation delay of the CC thus remapped is compared with the DDUL. If the result of the comparison operation exceeds the DDUL, then the next CCE located next, in the direction of signal propagation, is subjected to remapping by a high-voltage (3 V) CC of the second type. Such operation is repeated until the signal propagation delay of the post-remapping CC becomes lower than the DDUL.

At steps S10–S12 (the second processing), the following are performed. Step S10 checks for the presence of a mixture of two different CCs, a 2 VCC and a 3 VCC, so arranged that the output of the 2 VCC serves as input to the 3 VCC. Every 2 VCC, which is found by step S10 to form such a mixture with a 3 VCC, is extracted at step S11. At step S12, remapping is performed in order that the extracted 2 VCC of the first type is replaced with a 3 Vlib which is a CC of the second type. After such remapping, the SIC logic synthesis algorithm returns to step S10, and steps S11 and S12 are repeated. The reasons for this is that remapping at step S12 may result in producing a new mixture.

The voltage type of CCs on the input and output sides of a register has already been determined by the foregoing logic synthesis, and the following are performed at steps S13–S15 (the third processing). At step S13, the individual registers are checked if they perform a level conversion in electric potential, in other words they are checked if they receive a low-level input (2 V) and provide a high-level output (3 V). A register that is found to perform no low-to-high level conversion, is mapped into a 2 V FF circuit shown in FIG. 4 or into a 2 V latch circuit shown in FIG. 7, at step S14. On the other hand, a register (a FF circuit or a latch circuit) that is found to perform a low-to-high level conversion, is mapped into a 2 V/3 V FF circuit shown in FIG. 5 or into a 2 V/3 V latch circuit shown in FIG. 8.

Figure 19A:
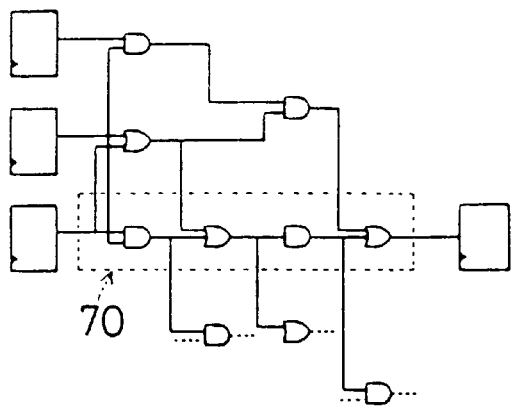
FIG. 19 is comprised of FIGS. 19(a)–(e) wherein FIG. 19(a) describes a first sequence of the first embodiment logic synthesis, FIG. 19(b) describes a second sequence, FIG. 19(c) describes a third sequence, FIG. 19(d) describes a final sequence.
FIG. 19(e) shows an example to be compared.
Figure 19B:
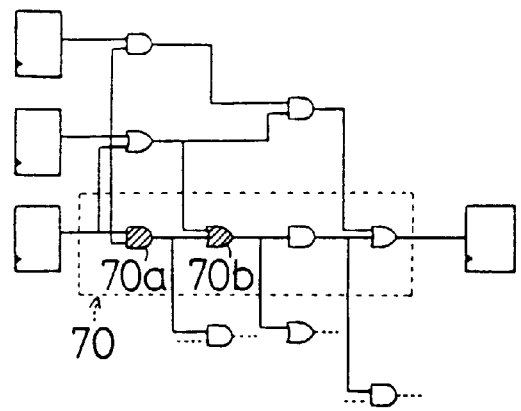
Figure 19C:
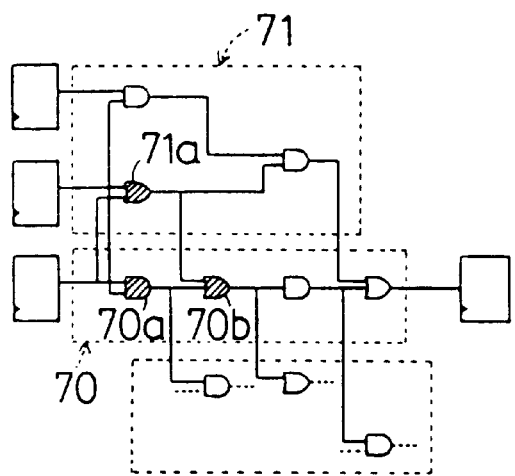

If every CC is subjected to mapping processing by 2 VCC of the first type, this causes a CC 70 of FIG. 19(a) connected between registers to have a signal propagation delay in excess of the DDUL. Then a first CCE 70a and a second CCE 70b of the CC 70 at the front thereof (i.e., the first two CCEs on the signal propagation start side) are mapped into 3 VCCs (see FIG. 19(b)), in the FIG. 13 algorithm. Thereafter, if the existence of a mixture of a 2 VCC and a 3 VCC, so arranged that the output of a CCE of the 2 VCC serves as input to the 3 VCC, is found, then the CCE (i.e., a CCE 71a of a 2 VCC 71) is remapped into a 3 VCCE (see FIG. 19(c)). Next, whether or not the remapping newly creates such a mixture is judged. For the case of FIG. 19(c), no mixture is found to exist. Accordingly, if a FF circuit is required to perform a level conversion from low-level input (2 V) to high-level output (3 V), the FF circuit is mapped to a 2 V/3 V FF circuit (hatched in FIG. 19(d)).

Figure 19D:
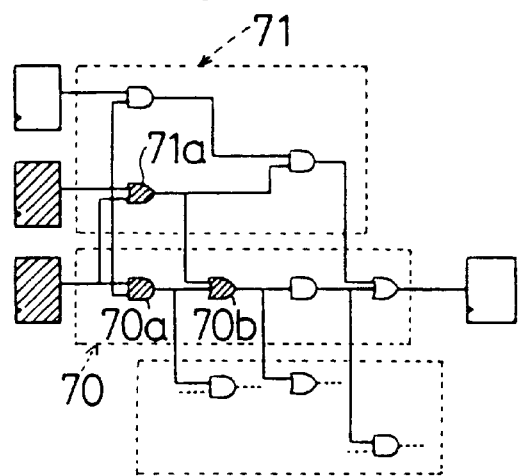
Figure 19E:
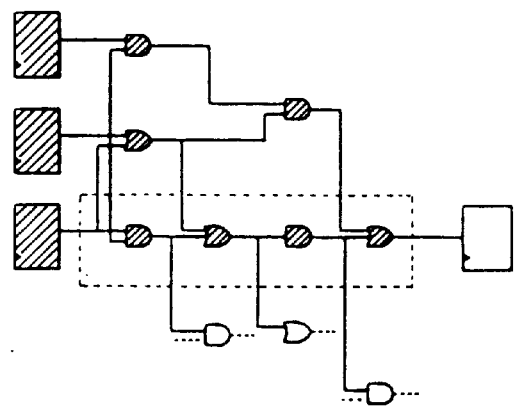

FIG. 19(d) shows a final SIC made in accordance with the present embodiment. One advantage of the present invention is that the number of CCEs to be mapped into a 3 VCCE an be reduced therefore rendering the power consumption lower in relation to a case where all the CCEs of the CC 70 having a signal propagation delay in excess of the DDUL is subjected to mapping processing by 3 VCCE.

EMBODIMENT 2

Figure 20:
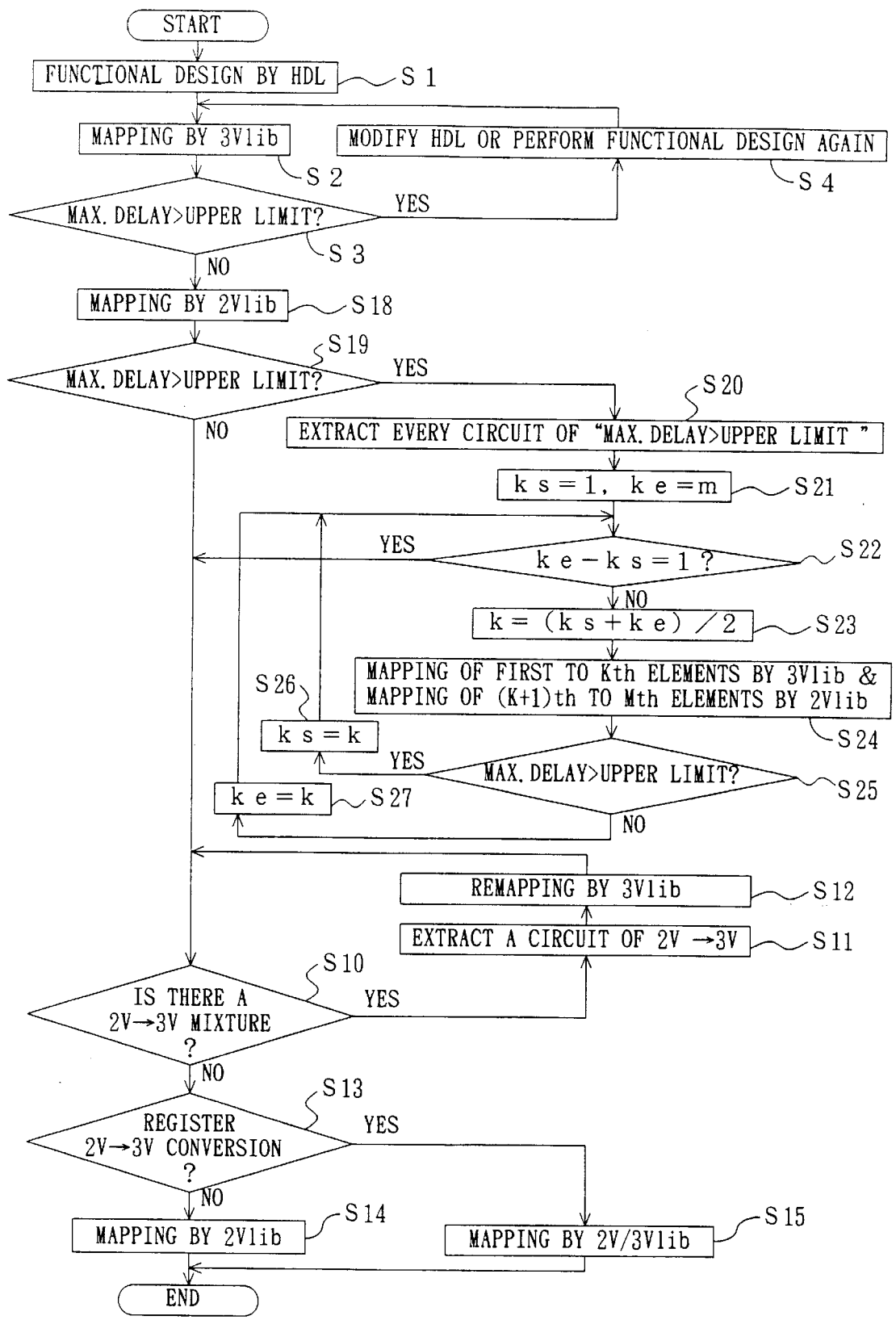
FIG. 20 is a flow chart diagram useful in understanding an SIC logic synthesis method in accordance with a second embodiment of the present invention.

FIG. 20 illustrates a second embodiment of the present invention. The second embodiment employs a binary search method in which the boundary between the front and rear sections of a CC (i.e., the boundary between a CCE to be mapped into a 3 VCC and a CCE to be mapped into a 2 VCC) is defined.

At steps S18–S27 (the first processing), the boundary between the front and rear sections of a CC is defined by means of binary search. Whereas the front section is mapped into a CC of the second type driven by the high-voltage (3 V) source 15, the rear section is mapped into a CC of the first type driven by the low-voltage (2 V) source 16.

The first processing is described in detail. At step S18, every CC is subjected to mapping processing by 2 VCC. At step S19, each CC thus mapped is checked if it has a signal propagation delay above the DDUL. Every CC with an excess delay is extracted at step S20 for further processing. More specifically, at step S21, a plurality of CCEs contained in a CC, which are subjected to mapping processing by 2 VCC, are assigned their respective addresses wherein the first of the CCEs is assigned an address of ks and the last is assigned an address of ke. The initial setting of ks is ks=1. The initial setting of ke is ke=m where the number m is the number of CCEs forming the CC. Thereafter, step S22 determines whether ke−ks=1 holds. If ke−ks=1, then no dichotomy can be made and the second processing immediately starts. However, it is originally set such that ke−ks≠1, and therefore, at step S23, k (the intermediate value) is found by the formula of k=(ks+ke)/2. At step S24, the first to kth CCEs are subjected to mapping processing by 3 Vlib and the (k+1)th to mth CCEs are subjected to mapping processing by 2 Vlib.

The signal propagation delay of the post-mapping CC is calculated. At step S25, the result of the calculation is compared with the DDUL. If the result exceeds the DDUL, ks (the first address) is set equal to k (the intermediate value) at step S26 in order that each of the (k+1)th to mth CCEs is further divided into two parts. On the other hand, if the result is less than the DDUL, ke (the last address) is set equal to k at step S27 in order that each of the first to kth CCEs is further divided into two parts. Thereafter, the program returns to step S22. It is judged, when ke−ks=1 at step S22, that the boundary between the front and rear sections of the CC is found. The program proceeds to the second processing.

The second processing and the third processing of the present embodiment are the same as in the first embodiment and therefore they are not described here.

For example, a case is explained in which a CC, comprised of a first half and a second half each containing ten stages of logic gates, has a critical path. In such a case, the first-half is remapped into 3 Vlib and the second-half is remapped into 2 Vlib. Whether SPD (signal propagation delay) is greater than DDUL (design delay upper limit), i.e., SPD>DDUL, is examined. If the result is YES, (a) the second-half of ten stages is further divided into two parts and (b) the five stages thereof, which are linked to the end, are remapped into 2 Vlib and the remaining stages are remapped into 3 Vlib. If the result is NO, (a) the first-half of ten stages is further divided into two parts, (b) the five stages thereof, which are linked to the starting point, are remapped into 3 Vlib and the remaining stages are remapped into 2 Vlib. Whether SPD is greater than DDUL is examined and the same processing as above is repeated. The use of binary search makes it possible to find a boundary by performing remapping processing several times, thereby achieving a fast processing rate.

EMBODIMENT 3

Figure 21:
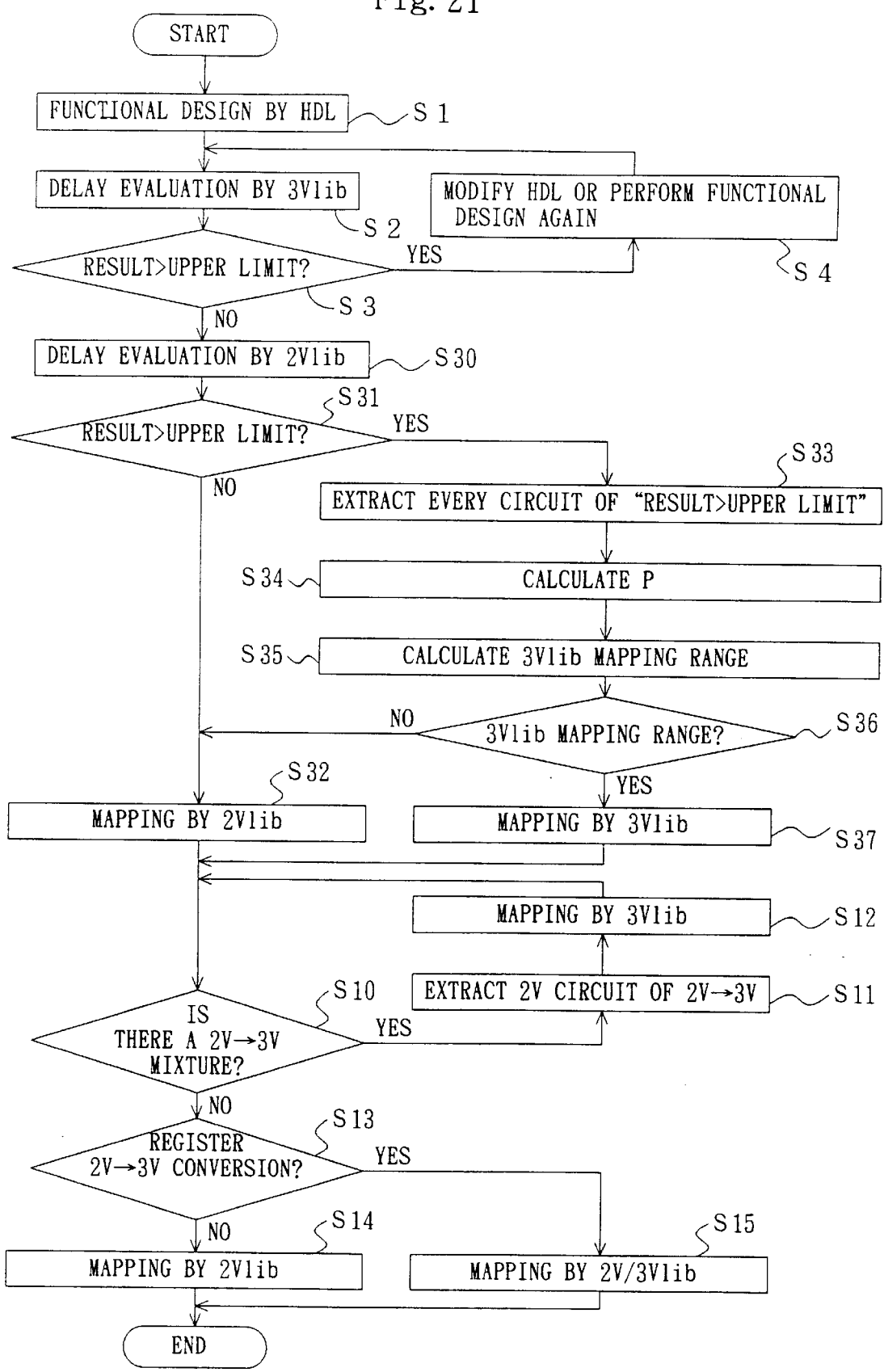
FIG. 21 is a flow chart diagram useful in understanding an SIC logic synthesis method in accordance with a third embodiment of the present invention.

FIG. 21 shows a third embodiment of the present invention. A boundary between the front and rear sections of a CC is estimated in the present embodiment.

At step S1, a functional design process is performed using HDL descriptions. The signal propagation delay of a CC in the case of mapping by 3 Vlib is estimated at step S2. The result of the estimation is compared with the DDUL at step S3. If the result exceeds the DDUL, either the HDL description is modified or a functional design process is performed over again to create a new HDL description at step S4 (see FIGS. 15 and 18).

At steps S30–S37 (the first processing), a boundary between the front and rear sections of a CC is roughly defined. The front section is mapped into a CC of the second type driven by the high-voltage source 15 and the rear section is mapped into a CC of the first type driven by the low-voltage source 16.

The first processing is explained in detail. Every CC is subjected to mapping processing by 2 Vlib. At step S30, the signal propagation delay of each CC thus mapped is estimated. At step S31, the result of the estimation is compared with the DDUL. Each CC, found by the compare operation to have a signal propagation delay below the DDUL, is subjected to mapping processing by 2 Vlib, at step S32.

All CCs, found by the compare operation to have a signal propagation delay above the DDUL, are extracted for further proceeding. At step S34, the result of the delay estimation is divided by the DDUL and the quotient is used to calculate p (the ratio of the presence of 3 Vlib to the presence of 2 Vlib). At step S35, p is multiplied by the number of logic gate (CCE) stages forming a CC, to calculate a mapping range of 3 Vlib (i.e., a range of logic gates forming the front section). Thereafter, whether or not each logic gate falls in the 3 Vlib mapping range is decided at step S36. A logic gate determined to fall in the range, is subjected to mapping processing by 3 Vlib at step S37. On the other hand, a logic gate determined not to fall in the range, is subjected to mapping processing by 2 Vlib at step S32.

The second processing and the third processing of the present embodiment are the same as in the first embodiment and therefore they are not described here.

Here suppose that the ratio of the delay of 3 Vlib to the delay of 2 Vlib is 1 to 1.8 and that the DDUL is 50 ns. For the case of a critical path having a delay of 90 ns, the entirety of the critical path becomes a 3 Vlib mapping range. For the case of a critical path having a delay of 50 ns, there exists no 3 Vlib mapping range so that all CCEs are subjected to mapping processing by 2 Vlib. Further, for the case of a critical path having a delay of 60 ns, ¼ of the critical path from its starting point is defined as a front section. This range is a range to be formed by 3 Vlib. For the case of a critical path having a delay of 70 ns, ½ thereof from its starting point is defined as a front section range that is subjected to mapping processing by 3 Vlib. For the case of a critical path having a delay of 80 ns, ¾ thereof from its starting point is defined as a front section range that is subjected to mapping processing by 3 Vlib.

In the present embodiment the boundary between a CCE that is subjected to mapping processing by 3 Vlib and a CCE that is subjected to mapping processing by 2 Vlib is roughly defined by estimation. This increases the rate of processing, although the accuracy of calculation for defining the boundary is not high. In usual logic synthesis, a remapping process may be performed on the basis of the result of a previously performed logic synthesis. In such a case, if an initial logic synthesis is carried out according to the present embodiment and a subsequent remapping process is carried out according to the first embodiment or according to the second embodiment, this arrangement not only improves the rate of logic synthesis processing but also increases the accuracy of boundary calculation. The number of CCEs that are subjected to mapping processing by 3 Vlib can be minimized and the power consumption can be lowered.

EMBODIMENT 4

Figure 22:
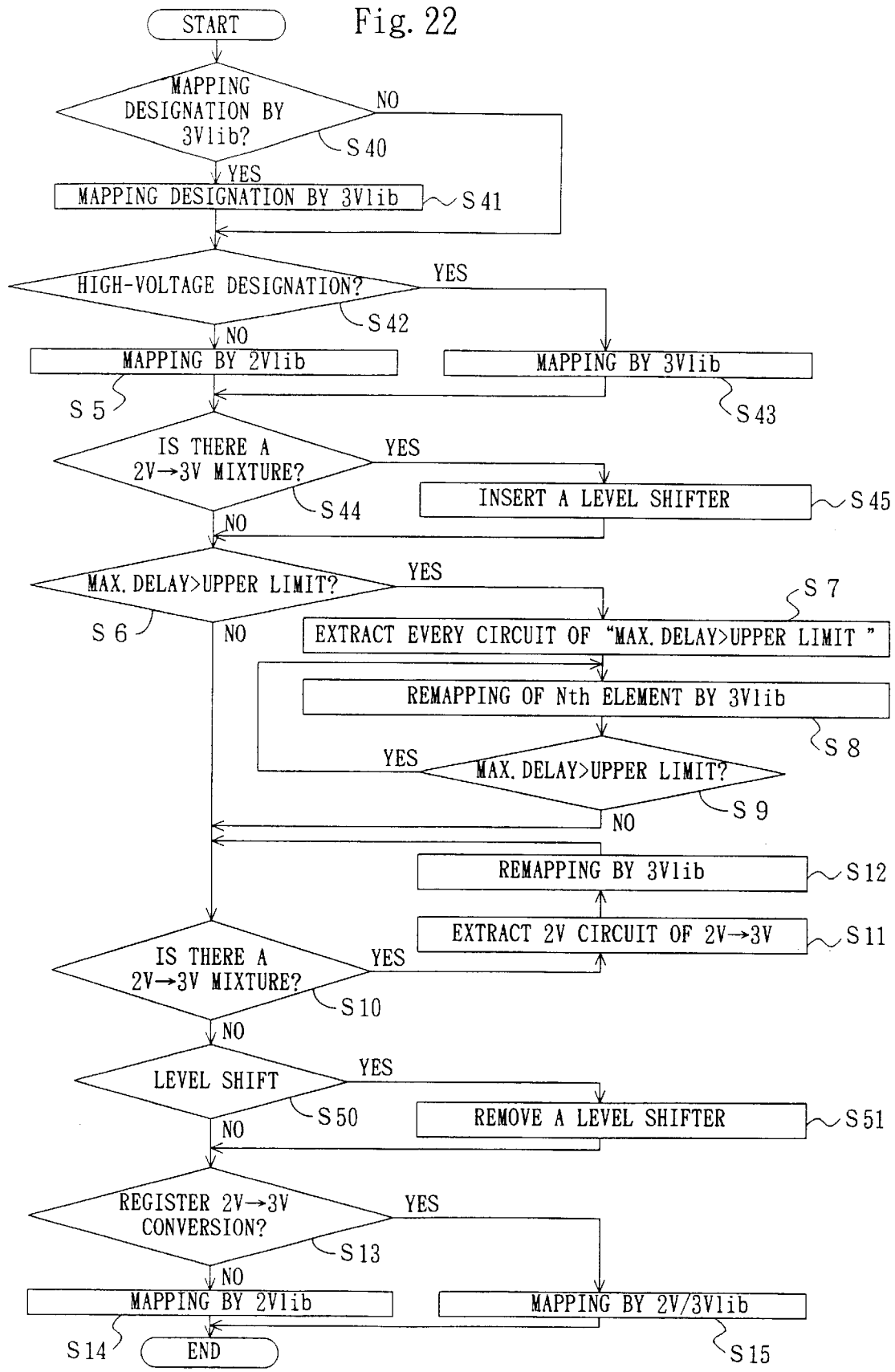
FIG. 22 is a flow chart diagram useful in understanding an SIC logic synthesis method in accordance with a fourth embodiment of the present invention.

FIG. 22 shows a fourth embodiment of the present invention. If it is anticipated that the mapping of a specified CCE or CCEs of a CC by 3 Vlib produces a low-power SIC, such a 3 Vlib mapping process is pre-performed in the present embodiment.

As can be seen from FIG. 22, new steps S40–S45 are added before the first processing (steps S5–S9). At step S40, whether the logic designer designates a specified CCE to be mapped by 3 Vlib is determined. If the logic designer designates a CCE to be mapped by 3 Vlib, it is arranged so that such mapping is designated by HDL at step S41. For example, a designation is made to the normal functional description of an adder which adds eight items of input data a–h in order that the last add element is subjected to mapping processing by 3 Vlib (see FIGS. 23 and 24). This designation is shown as "//low_power_synthesis_high-voltage" in FIG. 23.

Thereafter, a functional description is inputted. Step S42 checks for the presence or absence of such a designation. If no such designations are found, then all the CCEs are subjected to mapping processing by 2 Vlib. On the other hand, if there is found a designation, then the designated CCE is subjected to mapping processing by 3 Vlib.

Step S44 checks for the presence or absence of a mixture of a 2 VCCE and a 3 VCCE so arranged that the output of the 2 VCCE serves as input to the 3 VCCE. If the checking operation shows that there is such a 2 VCCE/3 VCCE mixture, then a level shifter, shown in FIGS. 6(a) and 6(b), is placed at the stage before the 3 VCCE at step S45.

The first to third processing of the present invention are basically the same as the ones in the first embodiment (FIG. 13) and therefore they are not explained. If no mixtures are found at step S10, then step S50 checks for the presence or absence of a level shifter between a 3 VCCE and another 3 VCCE. When a level shifter is found to lie between 3 VCCEs, the level shifter is removed at step S51. The reason for this is that it is anticipated that, when a 2 VCCE is replaced by a 3 VCCE by means of remapping in the second processing, a level shifter may be connected between that 3 VCCE and another 3 VCCE.

Figure 25A:
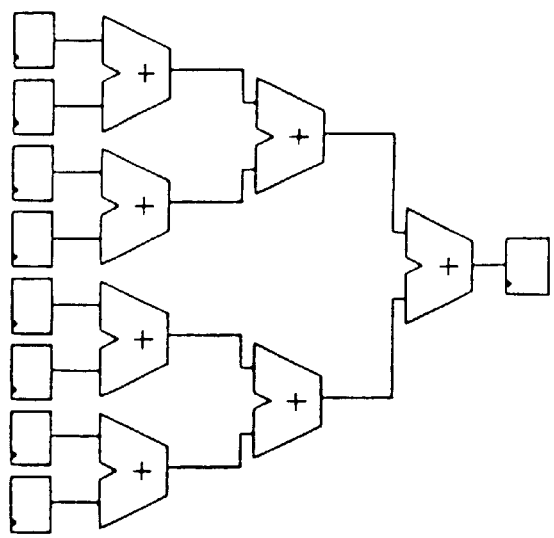
FIG. 25(a) shows the structure of a basic adder.
Figure 25B:
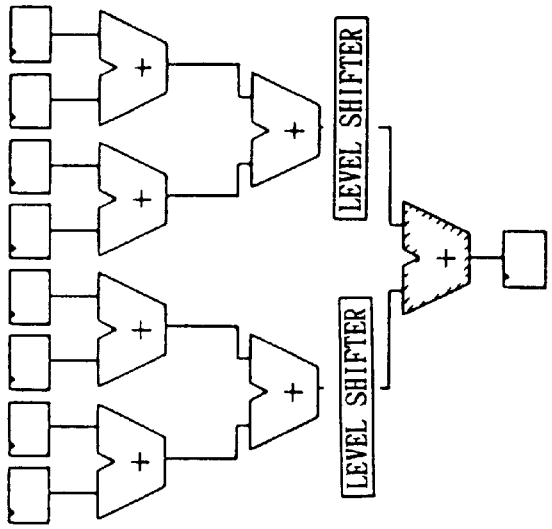
FIG. 25(b) shows an adder generated in accordance with the present invention.
Figure 25C:
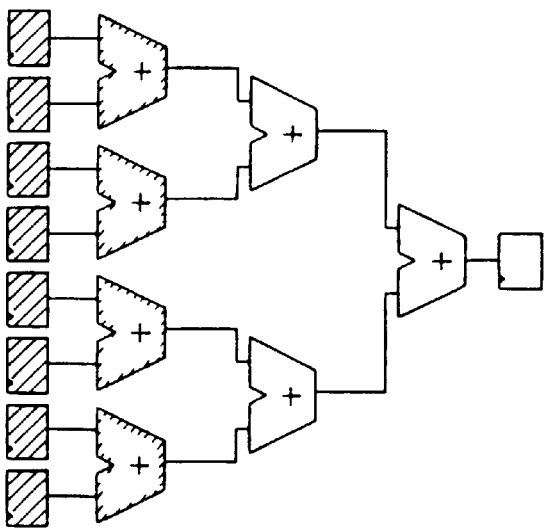
FIG. 25(c) shows an adder generated in accordance with a logic synthesis method to be compared.

In the present embodiment, the logic synthesis method of the first embodiment of FIG. 13, which uses the FIG. 24 functional description with no designation of subjecting a specified CCE to mapping processing by 3 Vlib, is constructed as follows. In an adder shown in FIG. 25(a) having seven add elements (arithmetic elements), the first four add elements (the hatched ones in FIG. 25(c)) are subjected to mapping processing by 3 Vlib and each of eight registers before these four add elements are subjected to mapping processing by a 2 V/3 V FF circuit. However, in accordance with the present embodiment, only the last-stage add element (the hatched one in FIG. 25(b)) is subjected to mapping processing by 3 Vlib and level shifters are provided at the stage before the last-stage add element. Therefore, the number of CCEs subjected to mapping processing by 3 Vlib is further reduced thereby cutting down the power consumption.

EMBODIMENT 5

Figure 26:
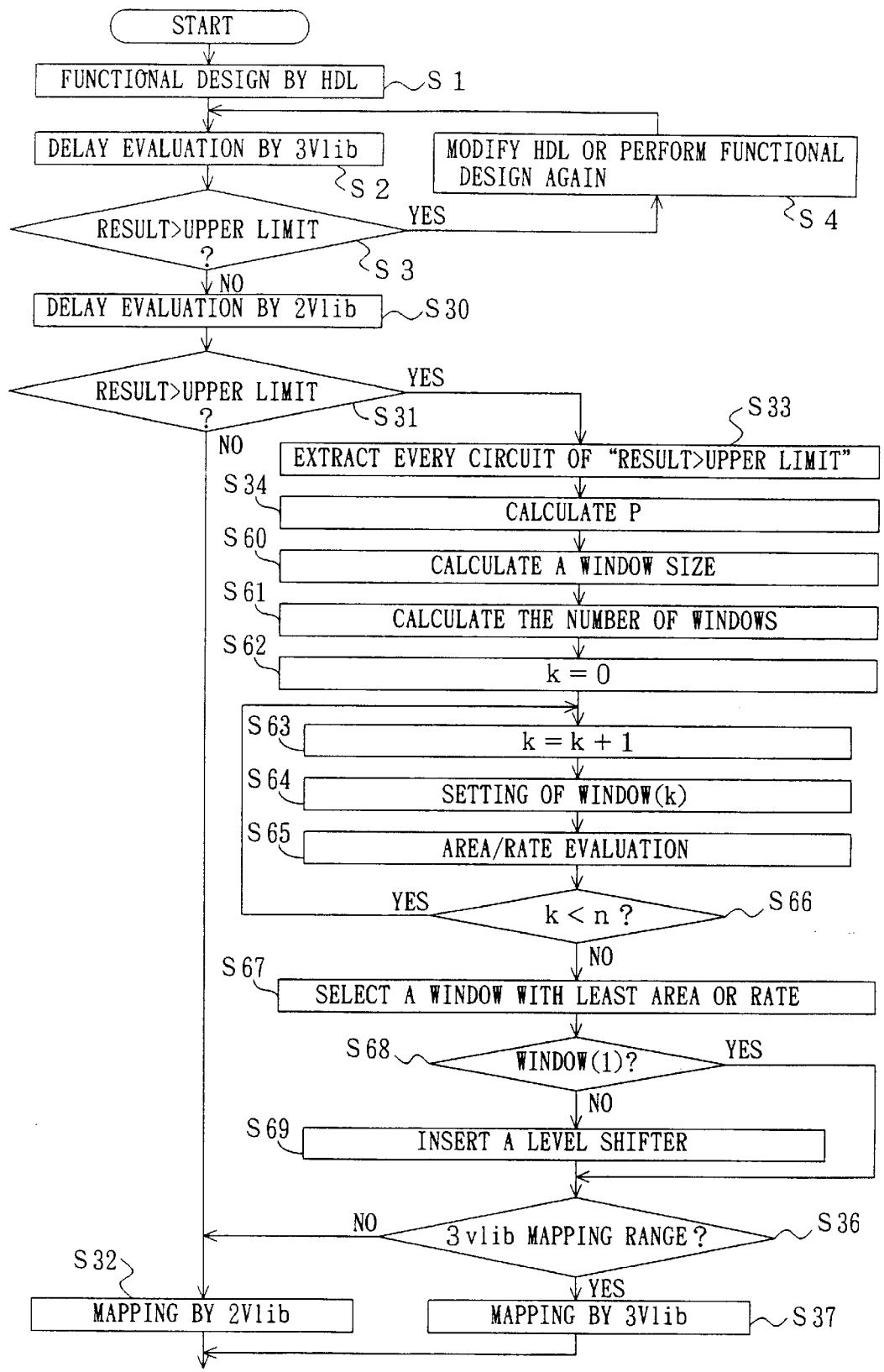
FIGS. 26 and 27 shows a flow chart diagram useful in understanding an SIC logic synthesis method in accordance with a fifth embodiment of the present invention.
Figure 28A:
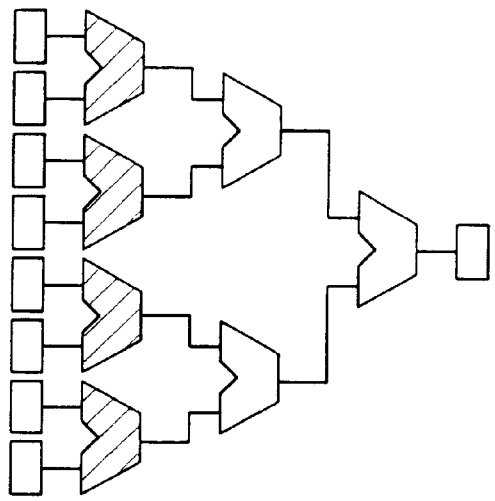
FIG. 28(a) shows CCEs (combinational circuit elements) within a first window of the fifth embodiment logic synthesis method.
Figure 28B:
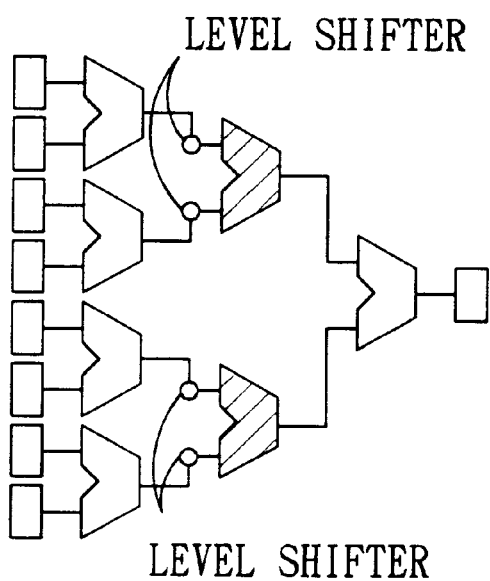
FIG. 28(b) shows CCEs within a second window thereof.

Referring now to FIGS. 26 and 28, a fifth embodiment of the present invention is illustrated. The present embodiment is characterized as follows. For the case of a CC having a signal propagation delay above the DDUL, it is arranged in the foregoing embodiment such that the front section of the CC is subjected to mapping processing by the second-type CC driven by the high-voltage (3 V) source 15. In the present embodiment, however, what section is to be subjected to mapping processing is chosen according to the area or rate of processing.

Figure 27:
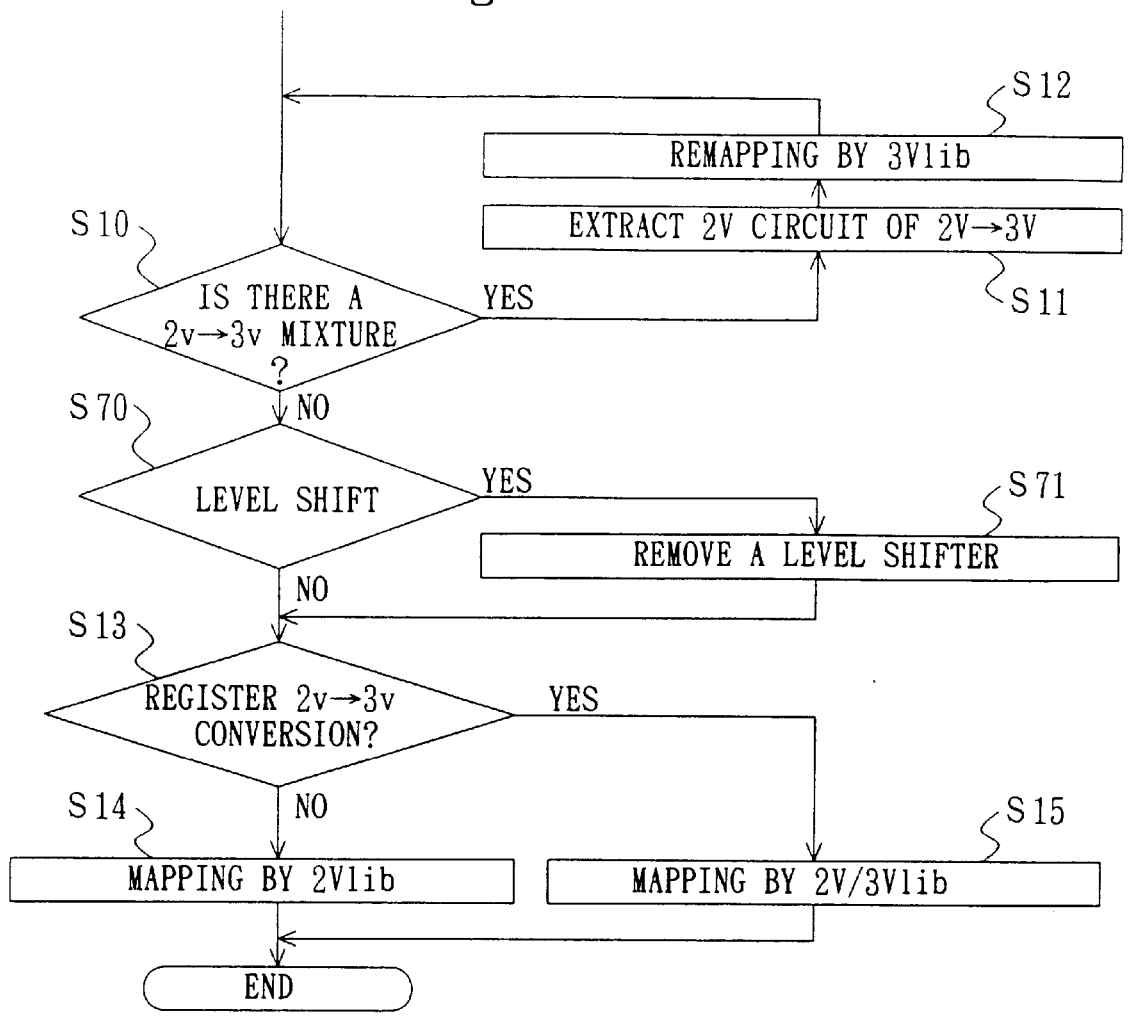

FIG. 26 shows part of the FIG. 21 flowchart of the third embodiment and FIG. 27 shows the remaining part thereof. Step S35 of the third embodiment is changed to steps S60–S69 and steps S70 and S71 are added between steps S10 and S13.

As step S34, the ratio of 3 Vlib to 2 Vlib in a single CC, p, is calculated according to the signal propagation delay estimation result and the DDUL. At step S60, p is multiplied by the total number of gate stages of the CC, to calculate the number of gate stages subjected to mapping processing by 3 Vlib (i.e., the range of mapping processing by 3 Vlib). At step S61, the number of windows contained in the CC, n, is calculated in which the mapping processing range is used as a search range (window). From step S62 on, the n windows are evaluated. More specifically, at step S62, a variable, k, is set to its initial value (=0). At step S63, it is set such that k=k+1. At step S64, a CCE within the first window is set. At step S65, the area and delay of the CCE of the first window are evaluated. Thereafter, at step S66, k is compared with n. If k<n, the program returns to step 63 at which the total areas and delays of CCEs of the second to nth windows are evaluated. At step S67, of the n windows, one that has the smallest total CCE area or the shortest delay is chosen. If the selected window is not the first window, then a level shifter is placed at the stage before the selected window.

If step S10 no longer finds the foregoing 2 V/3 V mixture, then step S70 checks for the presence or absence of a level shifter connected between 3 VCCEs. If a level shifter is found to exist, then the level shifter is removed at step S71 since such existence has resulted from the remapping processing in the second processing.

Figure 28C:
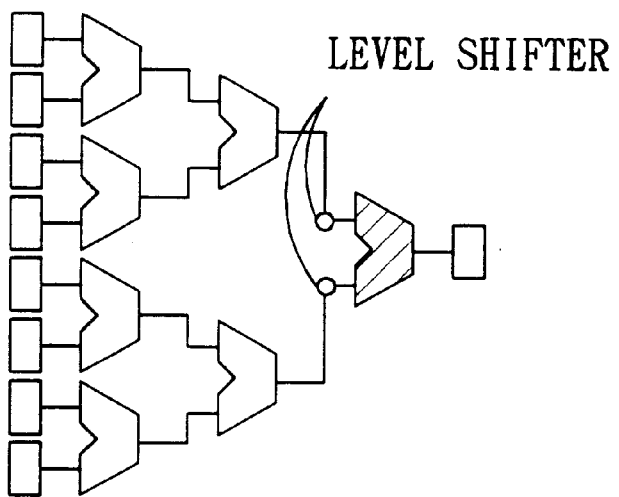
FIG. 28(c) shows CCEs within a third window thereof.

The present embodiment has the following advantages. In FIG. 28, of the three windows the third window of FIG. 28(c) is the smallest total add element area (count) and therefore this range is subjected to mapping processing by 3 Vlib. This minimizes the number of add elements subjected to mapping by 3 Vlib therefore further lowering the power consumption.

EMBODIMENT 6

Figure 34:
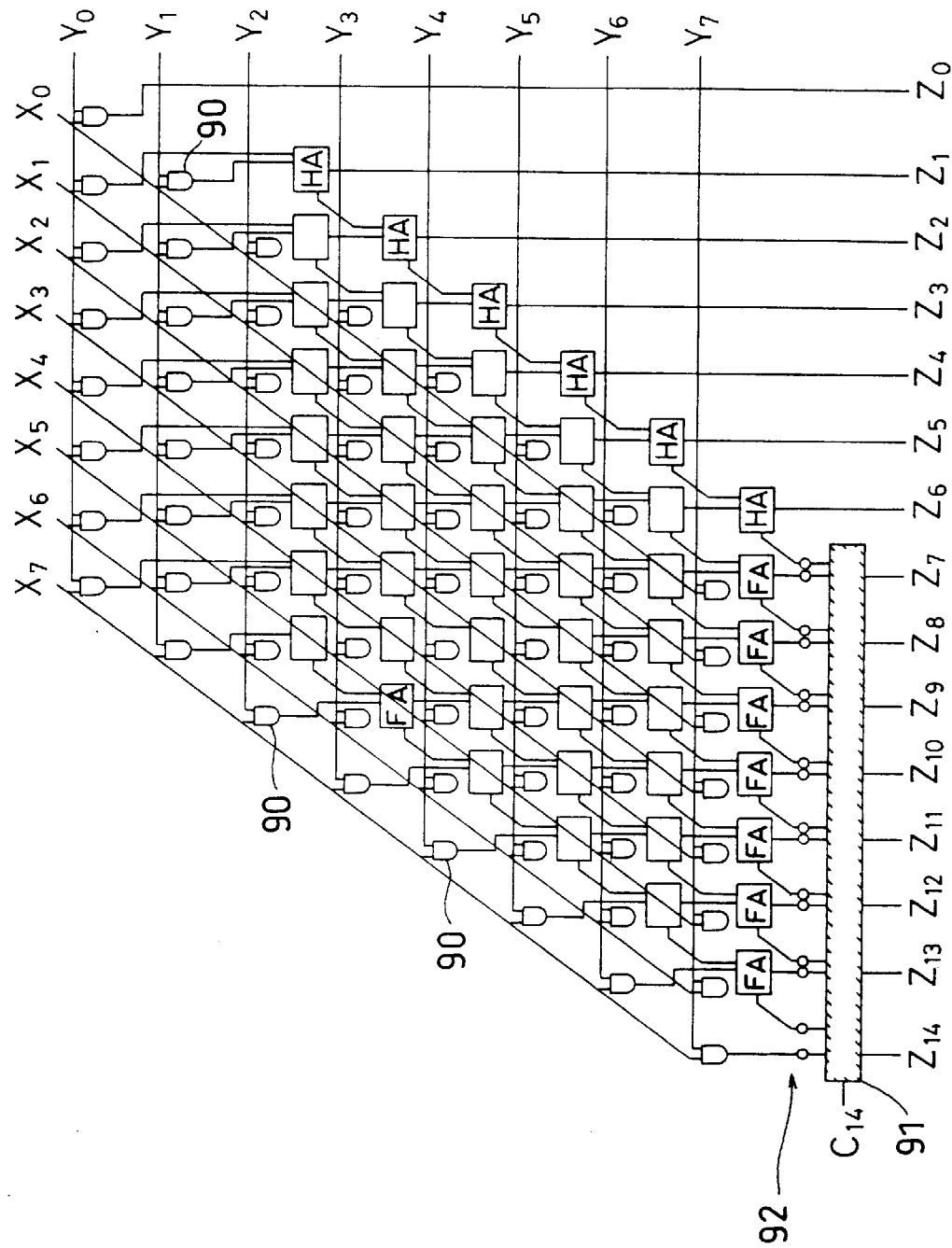
FIG. 34 is a circuit diagram of a multiplier of the carry save type generated by the sixth embodiment logic synthesis method.

Referring now to FIGS. 33 and 34, a sixth embodiment of the present invention is described. In the fourth embodiment, a CCE of an adder located at the last stage is subjected to mapping by 3 Vlib. In the present embodiment, a CCE of a parallel multiplier of the carry save type located at the last stage is subjected to mapping by 3 Vlib.

FIG. 33 shows a functional description including such a designation that a CCE of a parallel multiplier of the carry save type located at the last stage is subjected to mapping processing by 3 Vlib. This functional description is fed into the input (read-in) section 61 of the logic synthesis system 60.

FIG. 34 shows a parallel multiplier of the carry save type made by logic synthesis using a functional description fed to the input section 61. This multiplier is formed such that AND circuits 90, half adders (HAs), and full adders (FAs) are arranged in an array fashion. An multi-bit adder 91 is placed at the lowermost stage in the array. The adder 91 is subjected to mapping processing by 3 Vlib and the remaining components are subjected to mapping processing by 2 Vlib. Sixteen level shifters 92 are placed at the stage before the adder 91. Each of the level shifters 92 receives from an adder located at its preceding stage a signal of 2 V, converts it to a high level of 3 V, and outputs it.

Most of the above-described multiplier may be formed of usual adders. However, the adder 91 must be a fast adder. The adder 91 may be implemented by, for example, a carry look ahead adder for high-speed processing. Since the adder 91 is of the high-voltage (3 V) type, this makes it possible to generate circuits that are superior in circuit scale as well as in power consumption. Additionally, faster multipliers can be achieved.

The present embodiment is described in terms of parallel multipliers of the carry save type. The present invention provides an arithmetic circuit applicable in subtracters, dividers, accumulating adders, accumulating subtracters, accumulating multipliers, and accumulating divider.

Although the description has been made for the functional block A, the present invention may be applied to the remaining functional blocks (i.e., the functional blocks B–D). The present invention may be applicable between the functional blocks excluding the functional block E.

In accordance with the present logic synthesis method, part of CCEs of a CC with a critical path are of the high-voltage (3 V) type and a level shifter is placed in a register located at the stage before such a critical path-containing CC. Like cases where in a critical path-containing CC only the critical path is driven by a high voltage, the need for determining where to place individual level shifters in a critical path-containing CC is eliminated. Additionally, the number of level shifters required can be reduced, which makes it possible to design SIC with ease. Further, the number of critical path-containing CCs is negligible in relation to the total number of CCs contained in an entire SIC and only part of CCEs of a critical path-containing CC are driven by the high-voltage source 15. Therefore, the increase in power consumption is held low and the remaining CCs without a critical path are driven by the low-voltage source 16, whereupon the entire SIC requires less power. Low power SICs can be realized.

Figure 30:
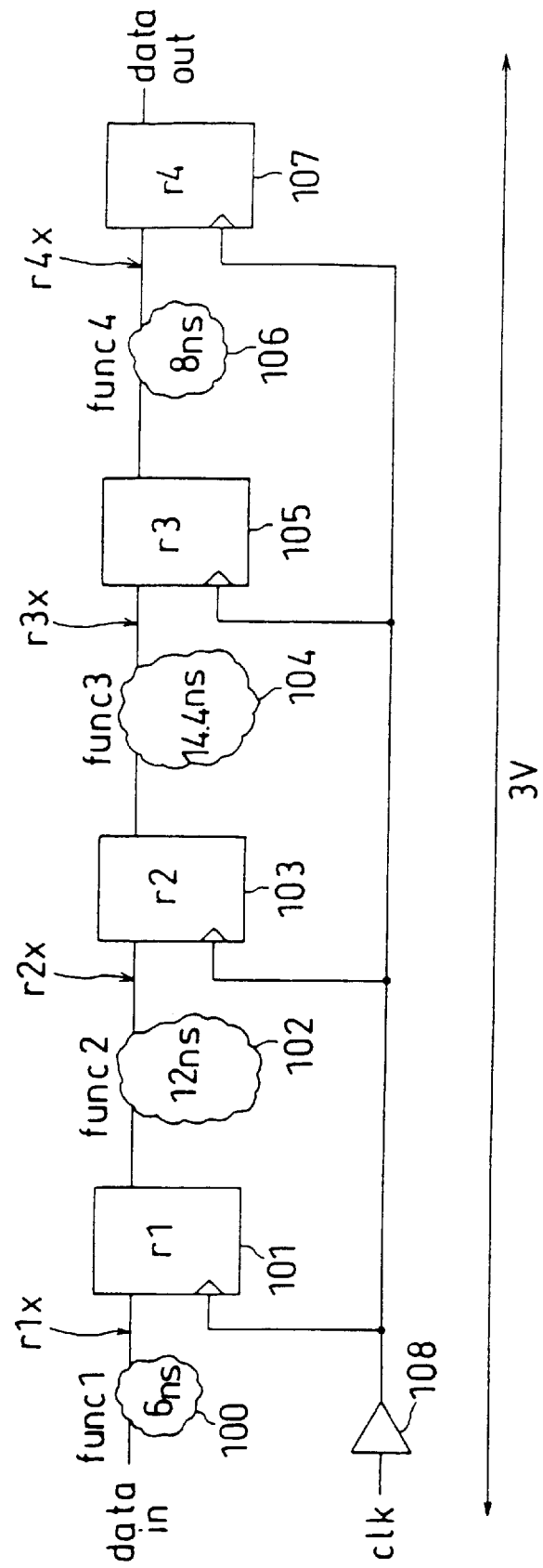
FIG. 30 shows a logic circuit of a conventional SIC.
Figure 31:
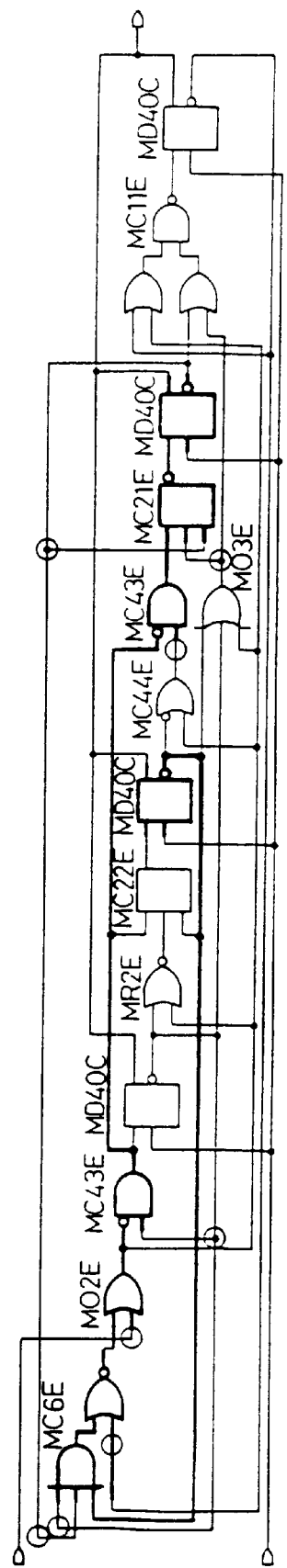
FIG. 31 shows the placement location of level shifters when only critical paths are driven by high voltage in an arbitrary SIC.
Figure 32:
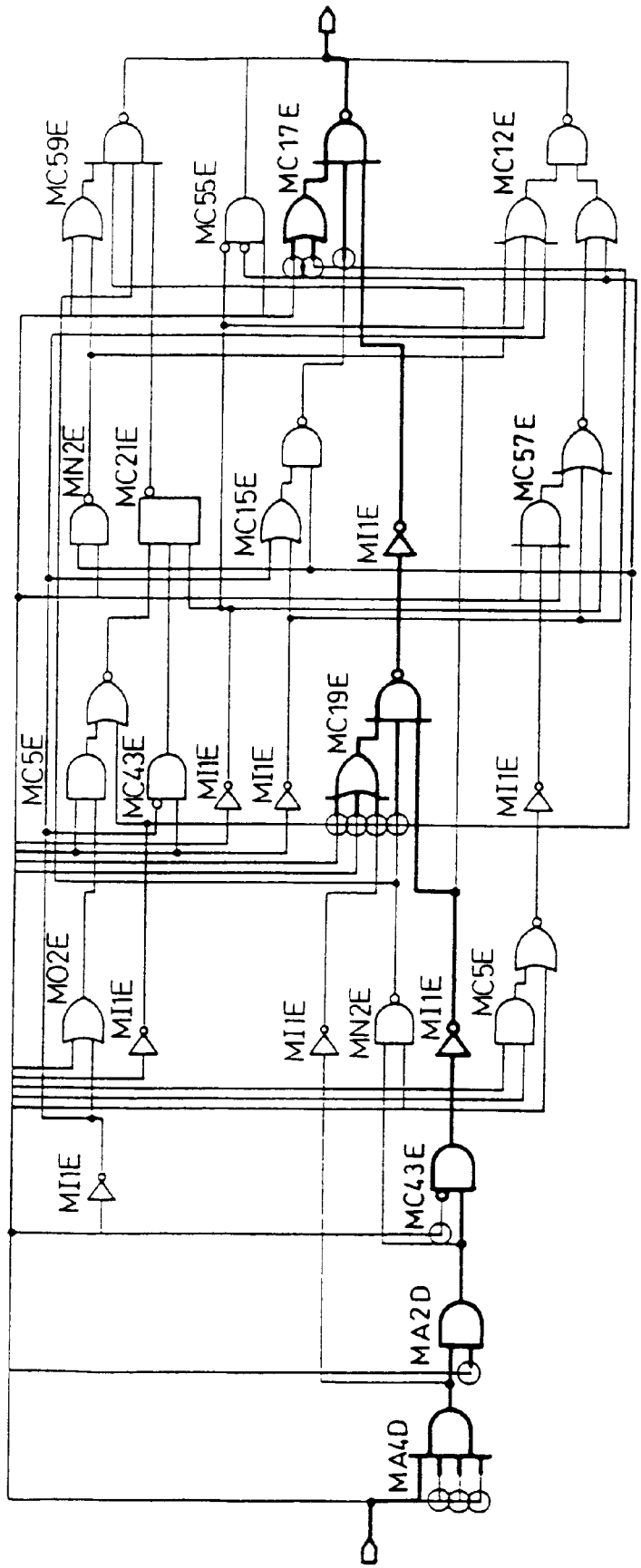
FIG. 32 shows the placement location of level shifters when only critical paths are driven by high voltage in another arbitrary SIC.

The FIG. 3 SIC of the present invention is compared with the FIG. 30 SIC of a prior art technique. This conventional SIC is first described. The CCs 100, 102, 104, and 106 have their respective signal propagation delay times, i.e., 6 ns, 14.4 ns, and 8 ns. Suppose that the time interval (delay) between the application at the input terminal of a flip-flop of a clock signal and the appearance at the output terminal of the clock signal is 2 ns. Since the CC 104 has a delay time of 14.4 ns which is the greatest among the other CCs, the maximum operating frequency of the FIG. 30 SIC is approximately 60.98 MHz from the formula of 1000/(2+14.4).

The FIG. 3 SIC of the present invention is explained. The critical path-containing CC 5, the front and rear sections of which are of the 3 V (high voltage) type and the 2 V (low voltage) type, respectively, has a signal propagation delay equal to the DDUL (for example, 20 ns). The signal propagation delay of the CCs 1, 3, and 7 with no critical path increases with the logic cell delay because the supply voltage is reduced from 3 V down to 2 V. It is assumed that, in the case of the FIG. 3 SIC, the low-voltage source causes the cell delay to become 1.5 times longer than is the case with the high-voltage (3 V) source. Of the CCs 1, 3, and 7 with no critical path the CC 3 has the greatest signal propagation delay, 18 ns.

In the present invention, two types of power sources, i.e., the low-voltage (2 V) source 16 and the high-voltage (3 V) source 15, are provided. As a result of such arrangement, the critical path-containing CC 5 has a delay of 18 ns (it is assumed that the low-voltage source 16 and the high-voltage source 15 cause the delay to become 1.25 times longer than is the case with the high-voltage source 15). The time interval (signal propagation delay) between the application at the input terminal of an FF circuit of a clock signal and the appearance at the output terminal of the clock signal (data), is 2 ns, and the delay of the CCs 3 and 5 is 18 ns. Therefore, the maximum operating frequency of the present SIC is 50 MHz.

$$1000/(2+18)=50 \text{ MHz}.$$

If the maximum delay is below the DDUL, this causes no problems. Even when the CCs 1, 3, and 7 with no critical path are driven by the low-voltage source 16 while the critical path-containing CC 5 is driven by both the low-voltage source 16 and the high-voltage source 15, the design maximum operating frequency can be met.

Figure 35A:
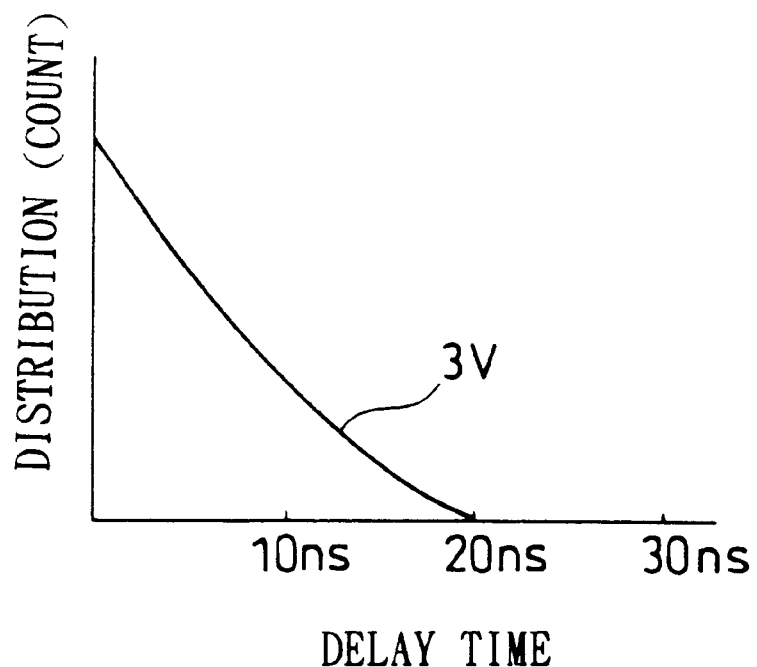
FIG. 35(a) is a graph showing the relationship between signal propagation delay and the number (distribution) of CCs having the signal propagation delay in a conventional technique and FIG. 35(b) is a graph showing the relationship between signal propagation delay and the number of CCs having the signal propagation delay in the present invention.
Figure 35B:
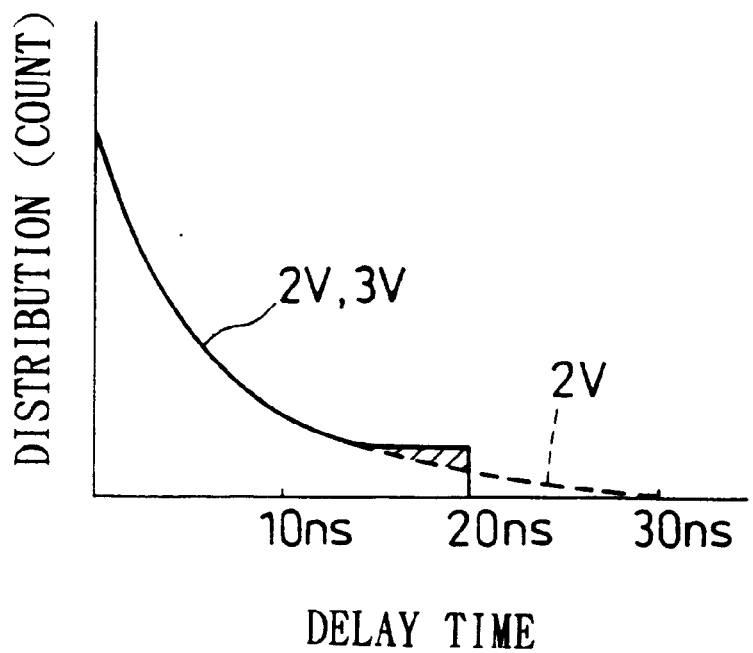

FIG. 35(*a*) shows a delay distribution in a conventional 3 V SIC in which the DDUL is 20 ns (i.e., the distribution of time intervals (time delays) between the time a clock signal is applied to an FF circuit and the time the data signal of the next FF is provided out of the FF circuit). In other words, FIG. 35(*a*) shows a distribution of signal propagation delay which is a sum of a register delay and a CC delay. FIG. 35(*b*) shows a delay distribution in an SIC in accordance with the present invention. If the supply voltage is changed from 3 V down to 2 V in the conventional SIC, this causes the maximum delay time to increase from 20 ns to 30 ns and the critical path delay time exceeds the DDUL of 20 ns. Conversely, in the SIC of the present invention, only critical path-containing CCs whose signal propagation delay exceed 20 ns when mapped by 2 Vlib are driven by the high-voltage source 15 and the remaining other CCs containing no critical path are driven by the low-voltage source 16. The DDUL of 20 ns can be met (see FIG. 35(*b*)).

Next, a conventional SIC and an SIC of the present invention are compared in circuit scale. If (a) the circuit scale of the conventional SIC is S, (b) 10% of all FF circuits are provided with a level shifter, and (c) there is a 10% area increase due to the difference in circuit structure between the 2 V/3 V FF circuit of the present invention and the conventional FF circuit, then the circuit scale of the present SIC is found by the following formula.

$$S \times 0.8 + S \times 0.18 + S \times 1.1 \times 0.02 = S \times 1.002$$

The circuit scale increase is limited to an increase of 0.25%.

If 5% of all FF circuits are provided with a level shifter, then the circuit scale of the present SIC is given by the following formula.

$$S \times 0.8 + S \times 0.19 + S \times 1.1 \times 0.01 = S \times 1.001$$

The circuit scale increase is limited to an increase of 0.1%.

EMBODIMENT 7

Figure 36:
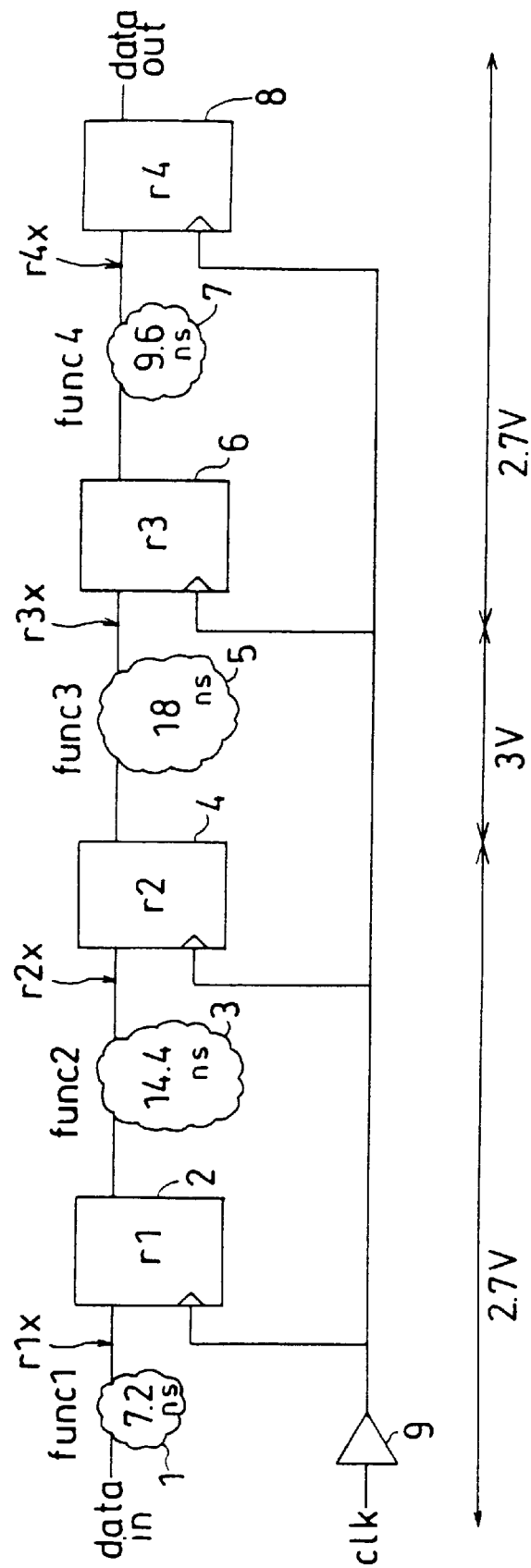
FIG. 36 shows an SIC generated in accordance with a logic synthesis method of a seventh embodiment of the present invention.
Figure 39:
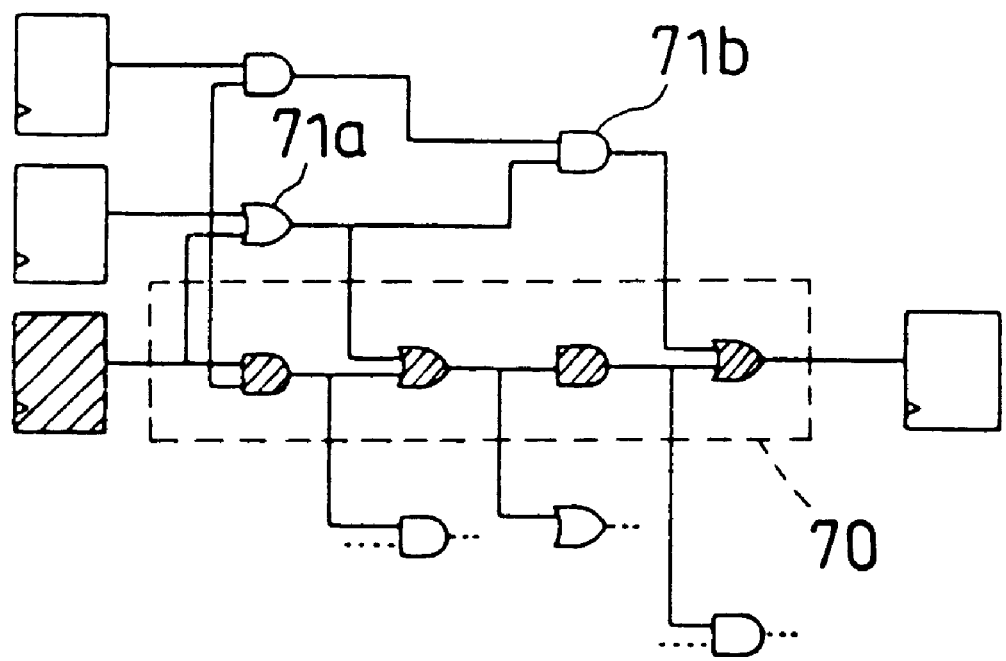
FIG. 39 shows a result of the seventh embodiment.
Figure 42:
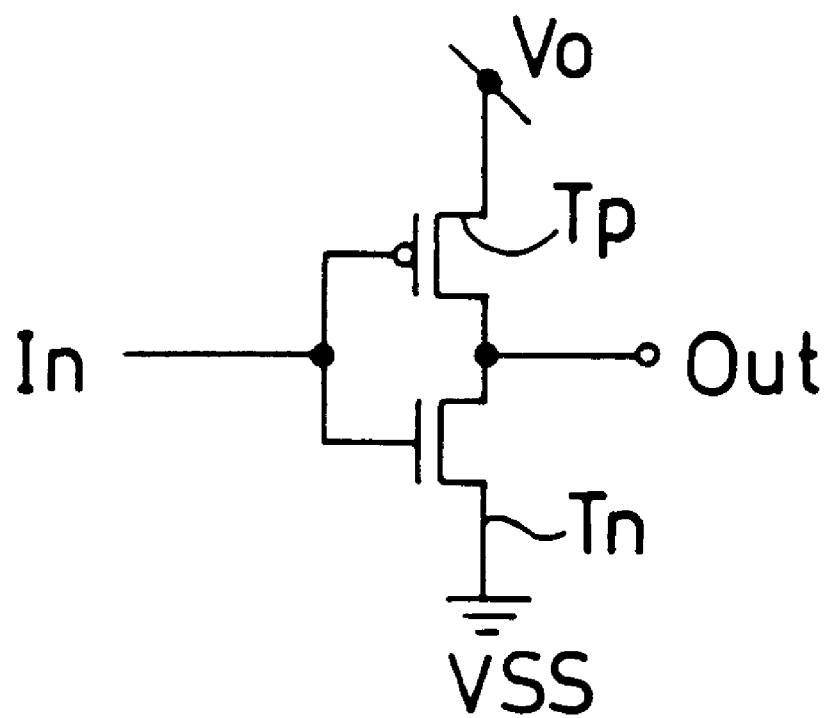
FIG. 42 depicts the structure of an inverter that is placed in a register.

Referring now to FIGS. 36 and 39, a seventh embodiment of the present invention is described. When using a combinational circuit of the high-voltage (3 V) type in each of the foregoing embodiments, a register located at the stage before the combinational circuit is provided with a level shifter. The reason for this is to prevent a through current from flowing in the inverters 34a and 34b forming the output buffer 32 of the flip-flop circuit (register) 2 of FIG. 4. The reason of why such a through current flows is described in detail. FIG. 42 shows the internal structure of the inverter 34. Connected in series between Vo (high voltage of 3 V) and VSS (ground) are a p channel transistor Tp and an n channel transistor Tn. The gates of Tp and Tn each receive a signal and a point where Tp and Tn are connected together serves as an output terminal of the inverter. The HIGH level of the input signal is 2 V (the low-voltage source 16). When the input signal is HIGH, Tn turns on while Tp does not turn off completely. As a result, a through current flows from the high-voltage source 15 to the low-voltage source 16.

If the potential difference between the high-voltage source 15 and the low-voltage source 16 is below Vt (the threshold voltage of Tp), this ensures that Tp completely turns off, and no through current flows. If the potential difference is set below Vt and if the high- and low-voltage sources 16 and 15 are a high-voltage (3 V) source and a low-voltage (2.7 V) source when, for example, Vt=0.5 V, such arrangement eliminates the need for providing level shifters. An example of this is shown below.

In a functional block shown in FIG. 36, the CCs 1, 3, 7 each are formed by a CC of the first type driven by the low-voltage (2.7 V) source and the CC 5 is formed by a CC of the second type driven by the high-voltage (3 V) source. The FF circuits 2, 4, 6 and 8 are of the 2.7 V type. These FF circuits of the 2.7 V type are identical in structure with the ones shown in FIG. 4 and are different from them only in power supply voltage.

Figure 37:
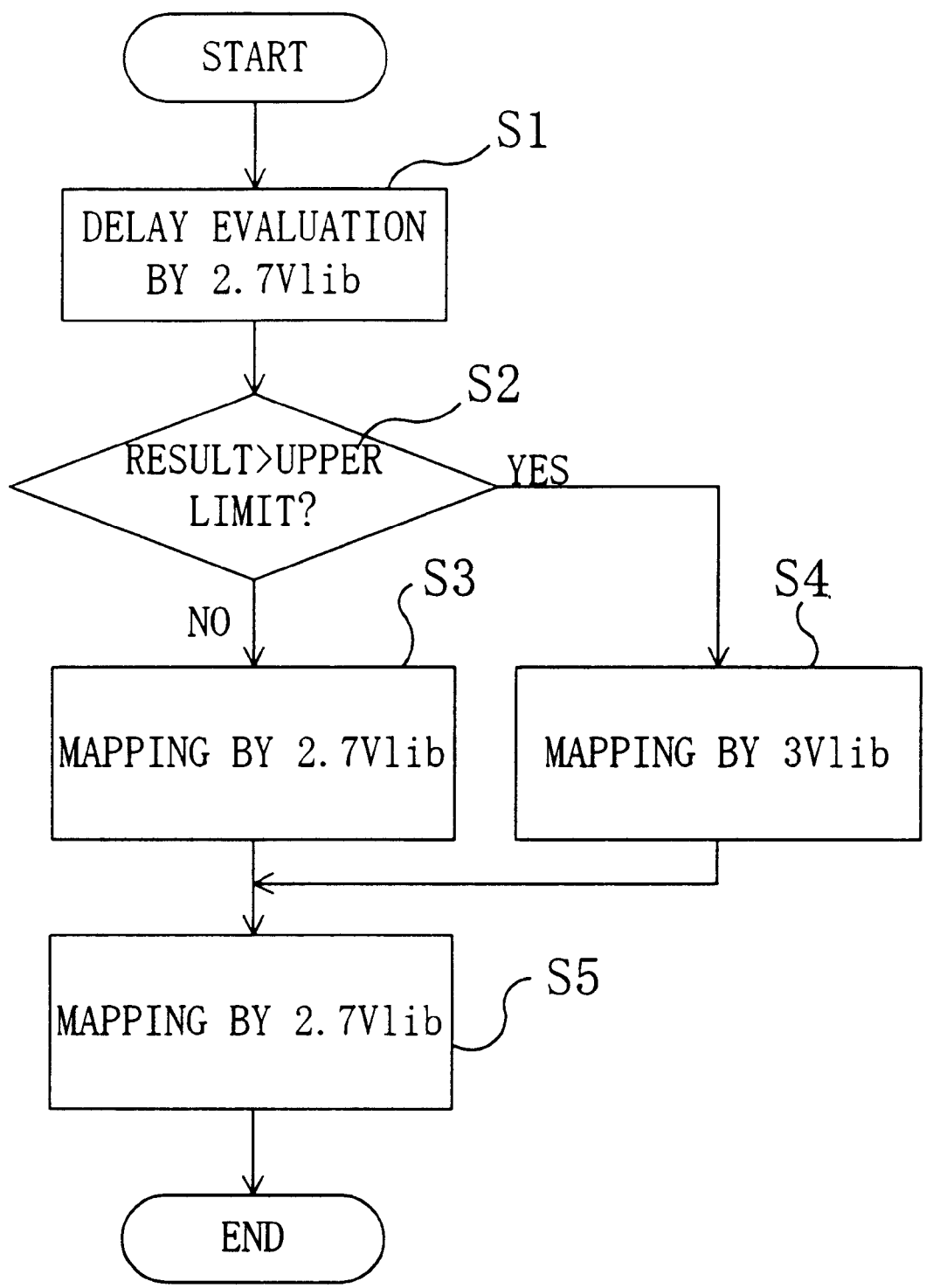
FIG. 37 is a flow chart diagram useful in understanding an SIC logic synthesis method of the seventh embodiment.

FIG. 37 shows a logic synthesis method for the FIG. 36 functional block. Each CC is subjected to mapping processing by 2.7 Vlib and at step S1 the signal propagation delay of the CC is estimated. Step S2 checks if the result of the estimation operation exceeds the DDUL. A CC with a signal propagation delay below the DDUL is subjected to mapping processing by 2.7 Vlib (the first type) at step S3. On the other hand, a CC with a signal propagation delay above the DDUL is subjected to mapping processing by 3 Vlib (the second type) at step S4. Thereafter, at step S5 each FF circuit is mapped into a 2.7 Vlib FF circuit.

Figure 38:
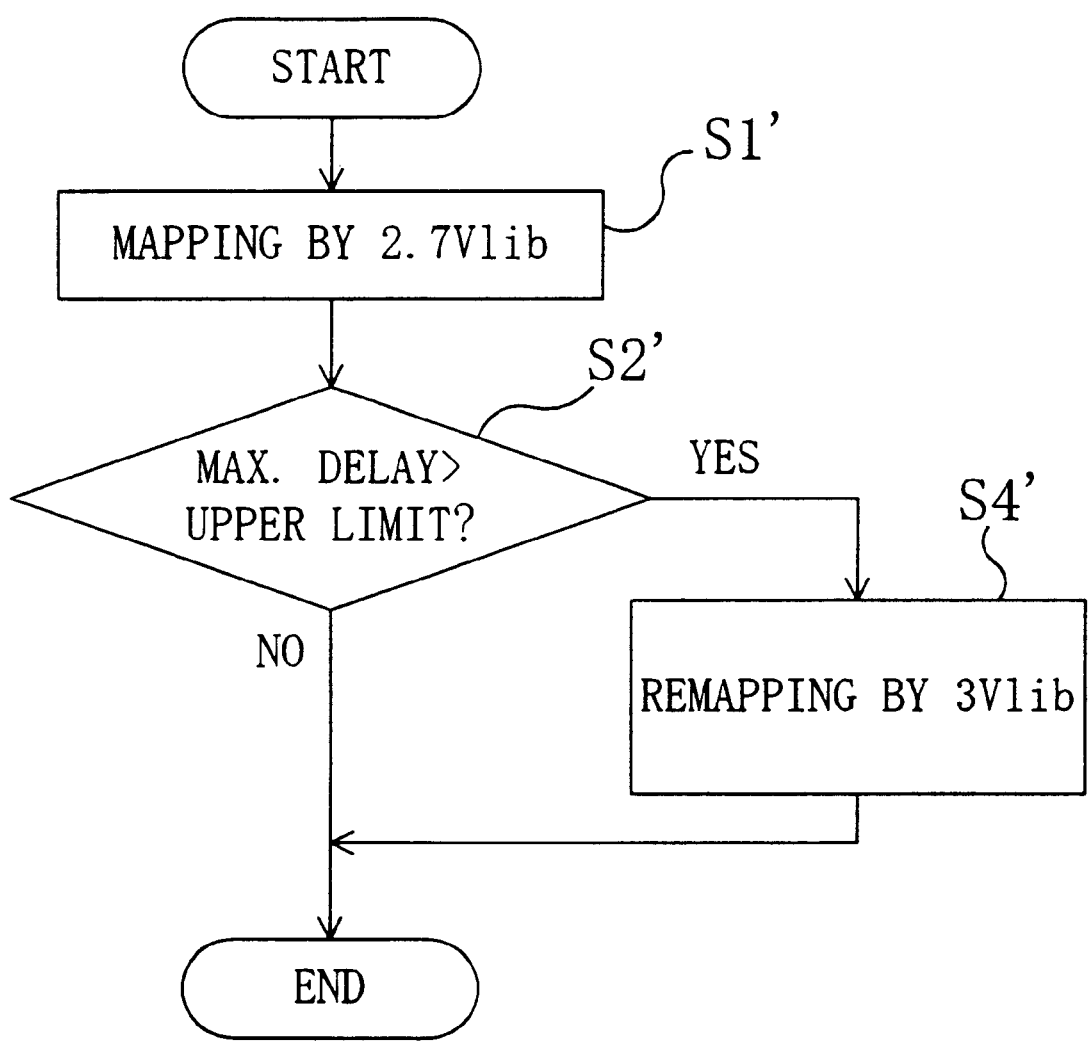
FIG. 38 is a flow chart diagram useful in understanding another SIC logic synthesis method of the seventh embodiment.

FIG. 38 shows a logic synthesis method. This method differs from the FIG. 37 logic synthesis method as follows. At step S1', all CCs and FF circuits are mapped by 2 Vlib. Step S2' checks each 2 Vlib CC if it has a signal propagation delay in excess of the DDUL. At step S4', any CC judged to have an excess delay is remapped to a 2.7 Vlib CC.

When the CC 70 connected between two registers has a signal propagation delay above the DDUL (see FIG. 39), the entirety of the CC 70 is subjected to mapping processing by 3 Vlib, and an FF circuit located at the stage before the CC 70 is subjected to mapping processing by an FF circuit of the 3 V type with no level shifter. In this case, it is arranged so that the CC 70 mapped by 3 Vlib receives a low-voltage (2.7 V) signal from the CCEs 71a, 71b. Since the CC 70 is able to operate normally even when it receives such a low-voltage signal, the CCEs 71a and 71b are not subjected to mapping processing by 3 Vlib.

Figure 40:
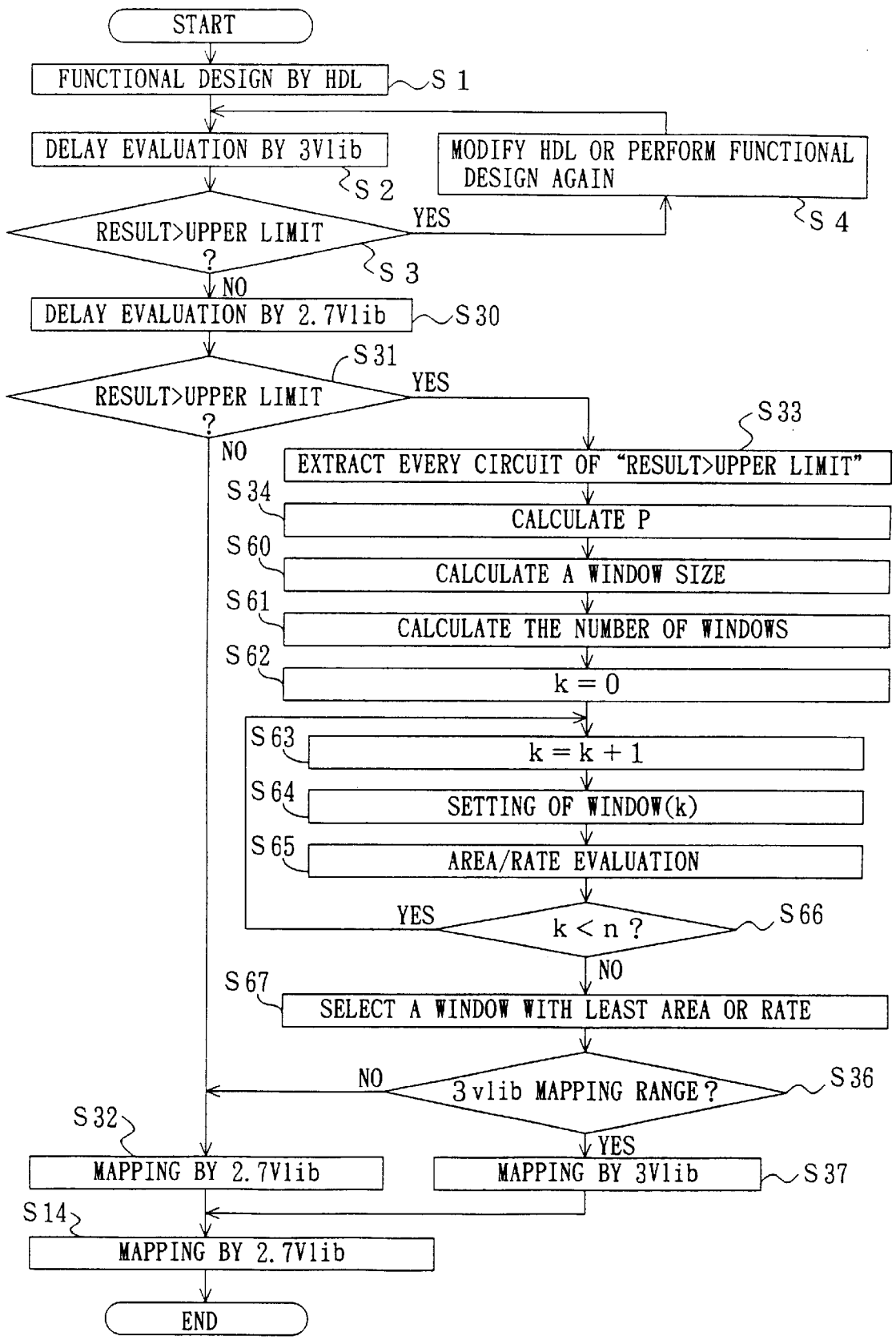
FIG. 40 is a flow chart diagram useful in understanding still another SIC logic synthesis method of the seventh embodiment.

FIG. 40 shows a modification of the present embodiment. In the present embodiment, if there is a CC with a signal propagation delay in excess of the DDUL, then the entirety of that CC is mapped into a 3 Vlib CC. In this modification embodiment, part of the CC is mapped into 3 Vlib and the remaining is mapped into 2.7 Vlib. What part is to be mapped into 3 Vlib is determined the same way as the second embodiment (see FIGS. 26 and 27). In this modification, no level shifters are required. This eliminates steps S68 and S69 of FIG. 26 and steps S70 and S71 of FIG. 27.

Figure 41A:
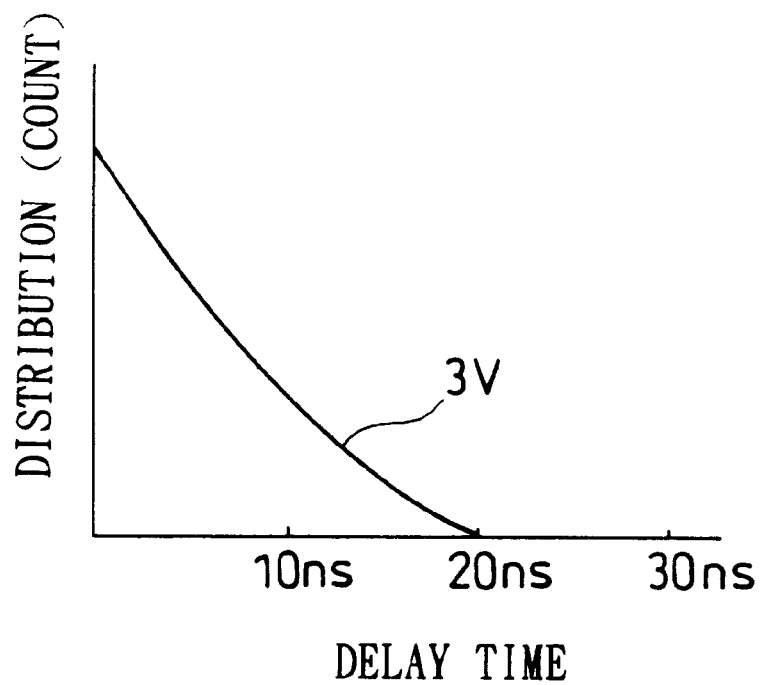
FIG. 41(a) is a graph showing the relationship between signal propagation delay and the number (distribution) of CC having the signal propagation delay in a conventional technique and FIG. 41(b) is a graph showing the relationship between signal propagation delay and the number of CCs having the signal propagation delay in the present invention.
Figure 41B:
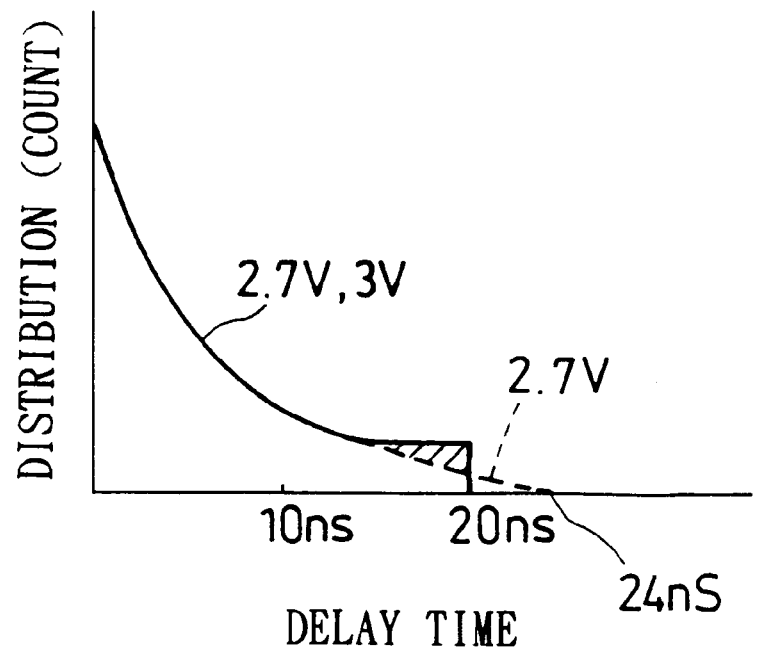

Advantages of the present embodiment can be seen from FIG. 41. Here, DDUL=20 ns. If an SIC of the 3 V type, the delay distribution of which is shown in FIG. 41(a), is changed to one of the 2.7 V type, the maximum delay increases from 20 ns up to 24 ns (shown by broken line), exceeding the DDUL. In the delay distribution of a 2.7 V/3 V SIC of the present embodiment, however, the maximum delay time is 20 ns.

I claim:

1. A method for designing a semiconductor integrated circuit having a plurality of combinational circuits each of which includes a signal propagation path and having registers which are provided at stages respectively preceding and succeeding at least one of said plurality of combinational circuits, said method comprising:

a first step of mapping, when there exists a combinational circuit in said plural combinational circuits of which signal propagation path has a signal propagation delay not more than a design delay upper limit, said combinational circuit into a combinational circuit of a first type driven by a low voltage from a low-voltage source, and mapping, when there exists a combinational circuit in said plural combinational circuits of which signal propagation path has a signal propagation delay above the design delay upper limit, said combinational circuit into a combinational circuit of a second type of which part is driven by a high voltage from a high-voltage source and of which remaining part is driven by a low voltage from said low-voltage source in order that the signal propagation path of said combinational circuit has a signal propagation delay below the design delay upper limit; and a second step of remapping, when there is found as a result of checking, a mixture in which an output from said remaining part of said second-type combinational circuit that is driven by a low voltage from said low-voltage source is input to a part of another second-type combinational circuit that is driven by a high voltage from said high-voltage source, said remaining part of said second-type combinational circuit that is driven by a low voltage from said low-voltage source so as to be driven by a high voltage from said high-voltage source.

2. A method for designing a semiconductor integrated circuit according to claim 1, wherein, in said first step, said part of said second-type combinational circuit is a front section of said second-type combinational circuit and said remaining part of said second-type combinational circuit is a rear section of said second-type combinational circuit.

3. A method for designing a semiconductor integrated circuit according to claim 2, said first step including:

initially mapping all of said plural combinational circuits into respective combinational circuits of the first type;

determining whether there exists a first-type combinational circuit in said first-type combinational circuits of which signal propagation path has a signal propagation delay above the design delay upper limit, and if such a first-type combinational circuit is found to exist, remapping said first-type combinational circuit into a combinational circuit of the second type.

4. A method for designing a semiconductor integrated circuit according to claim 2 or claim 3, said first step including:

conceptually dividing, if there exists a combinational circuit of the first type that has a signal propagation delay above the design delay upper limit, said first-type combinational circuit into plural combinational circuit elements, and remapping the first of said plural combinational circuit elements into a combinational circuit of the second type so as to form a first remapped combinational circuit;

checking if said first remapped combinational circuit has a signal propagation delay above the design delay upper limit; and remapping, when said first remapped combinational circuit is found to still have a signal propagation delay above the design delay upper limit, the second combinational circuit element, located next to the aforesaid first combinational circuit element in the direction of signal propagation in said first-type combinational circuit, into a combinational circuit of the second type so as to form a second remapped combinational circuit, checking if said second remapped combinational circuit has a signal propagation delay above the design delay upper limit, and repeating said remapping/checking processing.

5. A method for designing a semiconductor integrated circuit according to claim 2 or claim 3, said first step including:

conceptually dividing, when a front section of a combinational circuit of the first type is remapped into a combinational circuit of the second type, said first-type combinational circuit into plural combinational circuit elements; and repeating a binary search for finding a combinational circuit element in said plural combinational circuit elements which becomes said front section until said first-type combinational circuit has a signal propagation delay below the design delay upper limit and the number of combinational circuits of the second type is minimized.

6. A method for designing a semiconductor integrated circuit according to claim 2, said first step including:

estimating, by making use of a combinational circuit of the first type and a register driven by a low voltage from said low-voltage source, a sum of signal propagation delays of said first-type combinational circuit and said register;

checking if said sum exceeds the design delay upper limit;

mapping, if said sum is found to be below the design delay upper limit, said first-type combinational circuit into a combinational circuit of the first type; and mapping, if said sum is found to be above the design delay upper limit, a front section of said first-type combinational circuit into a combinational circuit of the second type.

7. A method for designing a semiconductor integrated circuit according to claim 6, said first step including:

conceptually dividing, when a result of said signal propagation estimation operation shows that there exists a combinational circuit of the first type that has a signal propagation delay above the design delay upper limit, said first-type combinational circuit into plural combinational circuit elements, and calculating, based on the ratio of the signal propagation delay estimation result and the design delay upper limit, a ratio of the number of combinational circuit elements to be mapped into combinational circuits of the second type and the number of combinational circuit elements to be mapped into combinational circuits of the first type;

calculating, based on said number of combinational circuit elements forming said first-type combinational circuit and said calculated ratio, a range of a front section to be mapped into a combinational circuit of the second type; and mapping a combinational circuit element of said plural combinational circuit elements that falls in said calculated range into a combinational circuit of the second type, and mapping the remaining combinational circuit elements into combinational circuits of the first type.

8. A method for designing a semiconductor integrated circuit according to claim 1 further comprising, before said first step, the steps of:

designating a part of a combinational circuit to be mapped into a combinational circuit of the second type;

mapping said part into a combinational circuit of the second type; and placing a level shifter at a stage before said second-type combinational circuit, said level shifter being driven by a high voltage from said high-voltage source.

9. A method for designing a semiconductor integrated circuit according to claim 8 wherein said designated part of said combinational circuit is a rear section thereof.

10. A method for designing a semiconductor integrated circuit according to claim 8 or claim 9 wherein said designation is made by a functional description including a description that designates said part to be mapped into a combinational circuit of the second type and said functional description is inputted prior to said first step.

11. A method for designing a semiconductor integrated circuit according to claim 8 or claim 9 further comprising, after said second step, the step of:

removing a level shifter that is determined to lie between combinational circuits of the second type.

12. A method for designing a semiconductor integrated circuit according to claim 1, said first step including:

(i) setting in a combinational circuit of combinational circuit elements that has a signal propagation delay above the design delay upper limit a plurality of windows having a specified size, each said window serving as a search range;

(ii) selecting from among said plural windows a window that contains a group of combinational circuit elements of said elements whose total area or total delay is the smallest, and mapping said group as a part of said combinational circuit into a combinational circuit of the second type; and (iii) placing a level shifter at a stage before said mapped second-type combinational circuit.

13. A method for designing a semiconductor integrated circuit according to claim 12 wherein said window size is calculated based on said signal propagation delay and said design delay upper limit.

14. A method for designing a semiconductor integrated circuit according to claim 12 further comprising, after said second step, the step of:

removing a level shifter that is determined to lie between combinational circuits of the second type.

15. A method for designing a semiconductor integrated circuit according to claim 1 or claim 2, said second step including:

checking if said remapping from first type into second type produces a new mixture of a combinational circuit of the first type and a combinational circuit of the second type arranged such that an output from said first-type combinational circuit serves as an input to said second-type combinational circuit;

when such a new mixture is found to exist, remapping said first-type combinational circuit into a combinational circuit of the second type; and repeating said checking/remapping processing.

16. A method for designing a semiconductor integrated circuit according to claim 1 wherein:

register-transfer-level design data is inputted which describes a plurality of registers and a plurality of combinational circuits each of which is connected between said registers; and said logic cell interconnection information of said first step is generated from said design data.

17. A method for designing a semiconductor integrated circuit according to claim 1 wherein a net list descriptive of interconnection information of logic cells is inputted and wherein said logic cell information of said first step is generated from said net list.

18. A method for designing a semiconductor integrated circuit according to claim 1 wherein a schematic that represents interconnection information of logic cells is inputted and wherein said logic cell information of said first step is generated from said schematic.

19. A method for designing a semiconductor integrated circuit according to any one of claims 16, 17 and 18 wherein said logic cell interconnection information generated from said register-transfer-level design data, from said net list, or from said schematic is optimized and wherein said optimized information is used as said logic cell interconnection information of said first step.

20. A method for designing a semiconductor integrated circuit according to either of claims 1 or 2, further comprising a third step that includes:

checking each of said registers as to whether each of said registers provides a signal to said mapped or remapped second-type combinational circuit; and mapping a register in said registers which is judge as a register which provides a signal to said mapped or remapped second-type combinational circuit into a register which is driven by a voltage from a voltage source including said high-voltage source, and mapping a register in said registers which is judge as a register which does not provide a signal to said mapped or remapped second-type combinational circuit into a register which is driven by a low voltage from said low-voltage source.

21. A method for designing a semiconductor integrated circuit according to claim 20 further including, after said third step, the step of:

verifying each said register's timing.

22. A method for designing a semiconductor integrated circuit having a plurality of combinational circuits each of which includes a signal propagation path and having registers which are provided at stages respectively preceding and succeeding at least one of said plurality of combinational circuits, said method comprising:

a first step of mapping, when there exists a combinational circuit in said plural combinational circuits of which signal propagation path has a signal propagation delay not more than a design delay upper limit, said combinational circuit into a combinational circuit of a first type driven by a low voltage from a low-voltage source;

a second step of mapping, when there exists a combinational circuit in said plural combinational circuits of which signal propagation path has a signal propagation delay above the design delay upper limit, said combinational circuit into a combinational circuit of a second type driven by a high voltage from a high-voltage source;

and a third step of mapping each said register into a register driven by a low voltage from said low-voltage source;

wherein the difference in electric potential between a high voltage from said high-voltage source and a low voltage from said low-voltage source is held at a value below the threshold voltage of transistors forming said combinational circuits and registers.

23. A method for designing semiconductor integrated circuit according to claim 22, wherein an internal part of said second-type combinational circuit is driven by a high voltage from said high-voltage source and the remaining internal part of said second-type combinational circuit is driven by a low voltage from said low-voltage source.

24. A method for designing a semiconductor integrated circuit according to claim 22 or claim 23;

said first step including:

mapping all of said plural combinational circuits into combinational circuits of the first type and mapping all of said plural registers into registers driven by a low voltage from said low-voltage source; and determining whether there exists a combinational circuit in said mapped first-type combinational circuits that has a signal propagation delay above the design delay upper limit, and if such a combinational circuit is found to exist, remapping said combinational circuit into a combinational circuit of the second type.

25. A method for designing a semiconductor integrated circuit according to claim 22 or claim 23, said first step including:

estimating, by making use of a combinational circuit of the first type and a register driven by a low voltage from said low-voltage source, a sum of signal propagation delays of said first-type combinational circuit and said register;

checking if said sum exceeds the design delay upper limit;

mapping, if said sum is found to be below the design delay upper limit, said first-type combinational circuit into a combinational circuit of the first type; and mapping, if said sum is found to be above the design delay upper limit, said first-type combinational circuit into a combinational circuit of the second type.

26. A method for designing a semiconductor integrated circuit having a plurality of combinational circuits each of which includes a signal propagation path and having registers which are provided at stages respectively preceding and succeeding at least one of said plurality of combinational circuits, said method comprising:

a first step of mapping, when there exists a combinational circuit in said plural combinational circuits of which signal propagation path has a signal propagation delay not more than a design delay upper limit, said combinational circuit into a combination circuit of a first type driven by a low voltage from a low-voltage source; and a second step of mapping, when there exists a combinational circuit in said plural combinational circuits of which signal propagation path has a signal propagation delay above the design delay upper limit, said combinational circuit into a combinational circuit of a second type of which part is driven by a high voltage from a high-voltage source and of which remaining part of said combinational circuit is driven by a low voltage from said low-voltage source in order that the signal propagation path of said combinational circuit has a signal propagation delay below the design delay upper limit;

wherein said second step further includes:
  (i) setting a plurality of windows each having a specified size and serving as a search range in a combinational circuit of which signal propagation path has a signal propagation delay above the design delay upper limit, said combinational-circuit-elements; and
  (ii) selecting from among said plural windows a window that contains a group of combinational-circuit-elements of said elements whose total area or total delay is the smallest, and mapping said combinational-circuit-elements of said group into said part of said second-type combinational circuit.

27. A method for designing a semiconductor integrated circuit according to claim 26 wherein said window size is calculated based on said signal propagation delay time and said design delay upper limit.

28. A semiconductor integrated circuit having a plurality of combinational circuits each of which includes a signal propagation path and having registers which are provided at stages respectively preceding and succeeding at least one of said plurality of combinational circuits, wherein:
  (i) said plural combinational circuits are formed by combinational circuits of a first type driven by a low voltage from a low-voltage source and combinational circuits of a second type driven by a high voltage from a high-voltage source;
  (ii) each of said plural registers is formed by a register driven by a low voltage from said low-voltage source; and
  (iii) the difference in electric potential between a high voltage from said high-voltage source and a low voltage from said low-voltage source is held at a value below the threshold voltage of transistors forming said combinational circuits and registers.

29. A semiconductor integrated circuit according to claim 28 wherein an internal part of said second-type combinational circuit is driven by a high voltage from said high-voltage source and the remaining internal part thereof is driven by a low voltage from said low-voltage source.

30. A semiconductor integrated circuit according to claim 28 or claim 29 further comprising clock supply means which is driven by a low voltage from said low-voltage source and which applies a clock signal to each said register.

31. A semiconductor integrated circuit according to claim 28 or claim 29 wherein each said register is formed by a flip-flop circuit, said flip-flop circuit including:

a master latch and a slave latch which are driven by a low voltage from said low-voltage source and which are connected in series.

32. A semiconductor integrated circuit according to claim 28 or claim 29 wherein each said register is formed by a latch circuit that has a latch section driven by a low voltage from said low-voltage source.

* * * * *